US009814983B2

(12) United States Patent
Johnston et al.

(10) Patent No.: US 9,814,983 B2
(45) Date of Patent: *Nov. 14, 2017

(54) METHODS AND/OR SYSTEMS FOR DESIGNING VIRTUAL ENVIRONMENTS

(71) Applicant: Nintendo Co., Ltd., Kyoto (JP)

(72) Inventors: Rory Johnston, Redmond, WA (US); Vivek Melwani, Redmond, WA (US); Stephen Mortimer, Redmond, WA (US); Yukimi Shimura, Redmond, WA (US)

(73) Assignee: NINTENDO CO., LTD, Kyoto (JP)

( * ) Notice: Subject to any disclaimer, the term of this patent is extended or adjusted under 35 U.S.C. 154(b) by 759 days.

This patent is subject to a terminal disclaimer.

(21) Appl. No.: 14/446,661

(22) Filed: Jul. 30, 2014

(65) Prior Publication Data

US 2015/0024843 A1 Jan. 22, 2015

Related U.S. Application Data

(63) Continuation of application No. 13/249,736, filed on Sep. 30, 2011, now Pat. No. 8,821,234.

(60) Provisional application No. 61/497,011, filed on Jun. 14, 2011.

(51) Int. Cl.
| | |
|---|---|
| A63F 13/63 | (2014.01) |
| G06T 11/60 | (2006.01) |
| G06T 13/80 | (2011.01) |
| A63F 13/40 | (2014.01) |
| G06F 17/50 | (2006.01) |
| A63F 13/56 | (2014.01) |

(52) U.S. Cl.
CPC .............. *A63F 13/63* (2014.09); *A63F 13/10* (2013.01); *A63F 13/56* (2014.09); *G06F 17/5009* (2013.01); *G06T 11/60* (2013.01); *G06T 13/80* (2013.01); *A63F 2300/6009* (2013.01)

(58) Field of Classification Search
CPC ..... G06F 17/5009; G06T 11/60; G06T 13/80; A63F 13/63; A63F 13/10; A63F 13/56; A63F 2300/6009
See application file for complete search history.

(56) References Cited

U.S. PATENT DOCUMENTS

| | | | |
|---|---|---|---|
| 5,287,446 A | 2/1994 | Williams et al. | |
| 5,592,609 A | 1/1997 | Suzuki et al. | |
| 6,108,010 A | 8/2000 | Boezeman et al. | |
| 6,167,562 A * | 12/2000 | Kaneko | G06T 13/00 345/473 |
| 6,307,561 B1 * | 10/2001 | Doi | G06T 13/80 345/473 |
| 6,500,069 B1 * | 12/2002 | Ohba | A63F 13/10 345/157 |
| 7,587,274 B2 | 9/2009 | Kaldewey et al. | |
| 8,257,173 B2 | 9/2012 | Bergelt et al. | |
| 2004/0012594 A1 | 1/2004 | Gauthier et al. | |

(Continued)

*Primary Examiner* — Wilson Tsui
(74) *Attorney, Agent, or Firm* — Nixon & Vanderhye P.C.

(57) ABSTRACT

In an editor a plurality of valid start points are determined. Based on this plurality of start points a user may select one of the points. When a user selects one of the points, the editor determines at least one valid end point. The user may then draw a line between the selected point and a valid end point. As a result of the connection between the two points a new environment is created in the editor.

17 Claims, 20 Drawing Sheets

(56) References Cited

U.S. PATENT DOCUMENTS

| | | | |
|---|---|---|---|
| 2005/0264566 A1* | 12/2005 | Sommers | G06T 17/05 345/423 |
| 2008/0078758 A1 | 4/2008 | Shimura et al. | |
| 2009/0253517 A1* | 10/2009 | Bererton | A63F 13/12 463/42 |
| 2010/0211244 A1 | 8/2010 | Jeong et al. | |
| 2011/0304638 A1 | 12/2011 | Johnston et al. | |
| 2012/0169593 A1 | 7/2012 | Mak et al. | |
| 2012/0324385 A1 | 12/2012 | Johnston et al. | |

\* cited by examiner

METHODS AND/OR SYSTEMS FOR DESIGNING VIRTUAL ENVIRONMENTS

CROSS-REFERENCES TO RELATED APPLICATIONS

This application is a continuation of U.S. application Ser. No. 13/249,736, filed Sep. 30, 2011, which claims priority to U.S. Provisional Application No. 61/497,011 filed Jun. 14, 2011, the entire contents of which are hereby incorporated by reference.

STATEMENT REGARDING FEDERALLY SPONSORED RESEARCH OR DEVELOPMENT

Not applicable

FIELD

The technology herein relates to systems and/or methods for designing virtual environments. More particularly, the technology herein relates to creating, modifying, and/or deleting virtual objects and/or terrain from a virtual space.

BACKGROUND AND SUMMARY

Anyone who has built a plastic model of a car, airplane, ship or other article knows how rewarding the finished model can be and how much fun it can be to build it. Typically, a model builder carefully assembles the model using step by step instructions. Different modeled parts are numbered and sequenced allowing the model builder to starting with sub-assemblies and end with the final assembly, sanding, and painting. Models that are the most fun to build are designed so they can be assembled in one way. Portions of one part will interlock with corresponding portions of the proper mating part. In this way, the model builder (who may be a child) will not make a mistake, become confused and simply give up, or get too frustrated to continue.

On the other end of the spectrum, consider starting with a lump of clay and deciding to construct a statue, a pot, or other useful article. You can turn the lump of clay into anything you want. This is both a huge opportunity for a skilled artist and an intimidating challenge for the inexperienced. With no instructions to follow and with maximum flexibility available, most of us soon become disillusioned and do not know what to do next. Our attempts to create something interesting do not necessarily result in satisfying or aesthetically-pleasing results. Rather, it takes a skilled artisan to transform that lump of clay into a beautiful and functional pot, statue or other interesting article ready for the kiln.

The same tension between flexibility and creativity exists when using computer tools to generate visual scenes or virtual environments. Powerful drawing tools such as Adobe Illustrator allow a user to create virtually any image that can be conceived. Unfortunately, users who are less skilled, and perhaps less artistic, may have difficulty creating anything useful or aesthetically pleasing even though the creation tool is exceptionally powerful and the user can create anything he or she wants. In contrast, coloring books and paint by number oil paintings can be somewhat satisfying to complete, but there is little creativity involved. The painter or colorer simply fills in premarked areas with already-designated colors. While this can be a lot of fun for the very young, most teenagers and adults are interested in more creative pursuits.

Creativity is very important in conjunction with the design and use of virtual environments including animated movies, simulations, and video games. Vast amounts of creativity and design work are often required to create new and interesting landscapes and other virtual environments in which animated characters traverse and explore. Skilled video game designers, movie animators, and other virtual environment creators may spend months designing and enhancing virtual environments that are interesting, pleasing to the eye, and still be functional for animated characters to traversed the created virtual environments.

Part of the fascination of watching animated movies or playing adventure-type games is to see how animated characters can explore and discover new parts of the virtual environment, find hidden treasures, meet animated friends and enemies, and otherwise simulate adventure in a fantasy world that may be some ways be more interesting than the real world.

In the past, most virtual environments were designed and constructed by experts. These experts typically began with the equivalent of a lump of clay,—a white 3D pallet into which they could design and insert any kind of structure they could imagine. As with clay or paper, such a design process gives wonderful results for the skilled creative artisan, but ordinary users often lack the skill, vision, and/or creativity to create virtual environments that are both interesting and functional.

A few video games and other interfaces in the past have allowed users to create their own game levels or other virtual environments. In such contexts, it is often important to keep the tasks the users can execute relatively simple so that less skilled users can still have a successful interaction experience. Sometimes, this has limited the complexity of the resulting virtual environments to such an extent that more skilled users are simply not interested.

However, new and interesting techniques are continuously sought after to help unlock the almost endless boundaries of creativity among users.

Accordingly, it would be desirable to implement systems and/or methods that provide improved techniques to designing or modifying virtual environments.

Certain example embodiments herein may relate to techniques for facilitating user content creation on a computer system.

In more detail, exemplary illustrative non-limiting implementations herein allow users to create relatively complex 2D and/or 3D virtual structures to be traversed by animated characters. Users can create such structures by, among other things, placing inclined surfaces between existing structures so that animated characters can move from one structure to another within the virtual environment. In exemplary illustrative non-limiting implementations, users receive an automatic assist in terms of placing endpoints of the inclined structures within the virtual environment. For example, rather than allowing users to position inclined surface endpoints arbitrarily at any location within a 3-dimensional virtual space, exemplary illustrative non-limiting implementations of a virtual structure editor calculate a limited set of start and end positions for placement of such virtual inclined structures. A user may then select between the allowable start and end positions.

BRIEF DESCRIPTION OF THE DRAWINGS

These and other features and advantages will be better and more completely understood by referring to the following detailed description of exemplary non-limiting illustrative embodiments in conjunction with the drawings of which.

DETAILED DESCRIPTION

Figure 1:
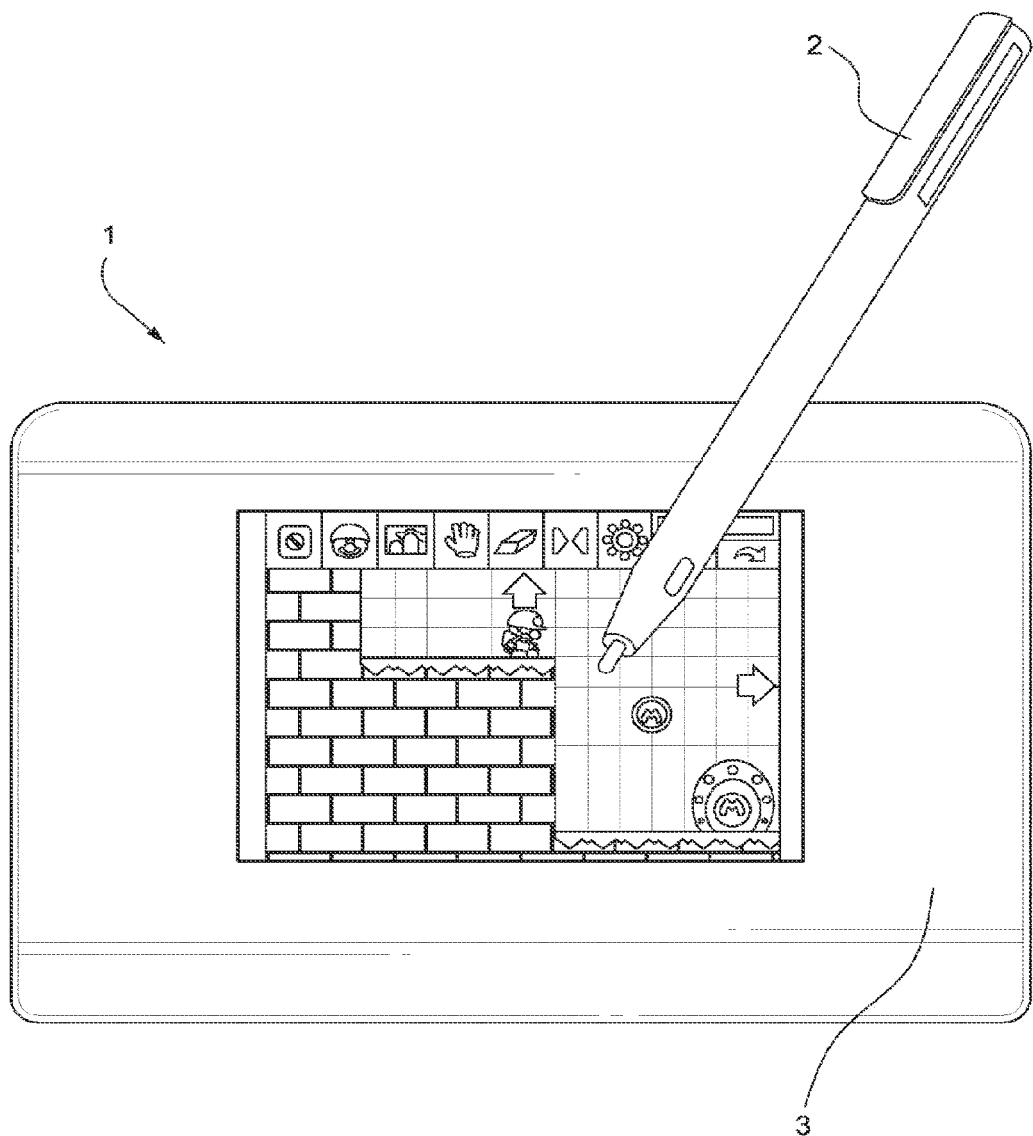
FIG. 1 is an illustrative example showing a user interacting with an exemplary editor program according to certain example embodiments.

FIG. 1 is an illustrative example showing a user interacting with an exemplary editor program on a touch screen display according to certain example embodiments. A computing device 1 includes a display screen 3. The display screen 3 also includes a touch screen with which a user interacts by using stylus 2. In certain example embodiments, the display screen may be an ordinary display (e.g., a LCD, CRT, etc). Instead of, or in addition to, the stylus 2, another type of user input may be used. For example, a keyboard, a mouse, a trackball, a touch pad, etc may be used to provide input into an editor program.

Figure 2A:
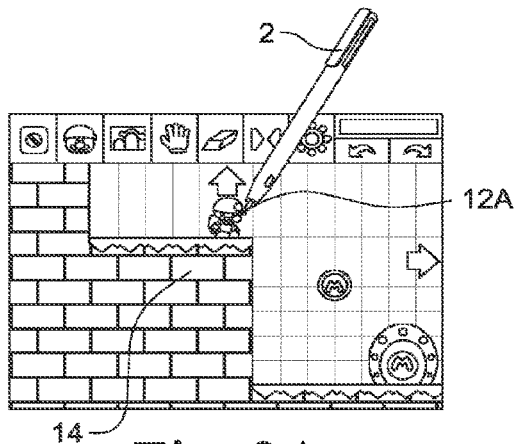
FIGS. 2A-2P show illustrative views of the user in FIG. 1 interacting with the exemplary editor program.
Figure 2B:
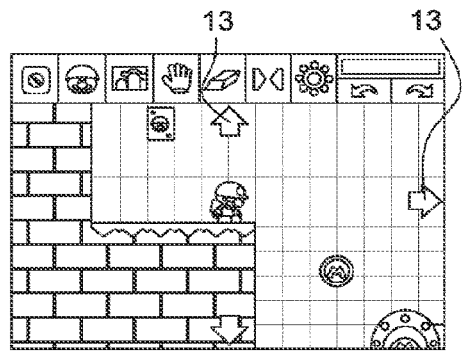
Figure 2C:
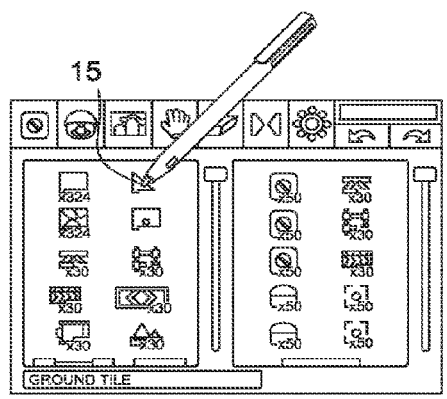
Figure 2D:
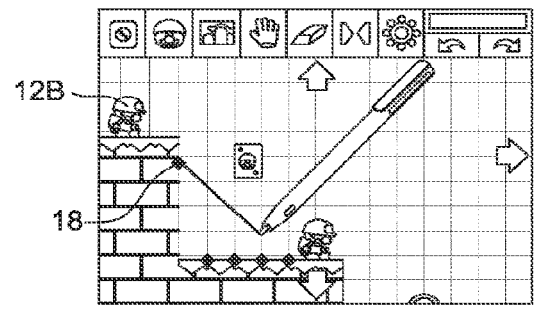
Figure 2E:
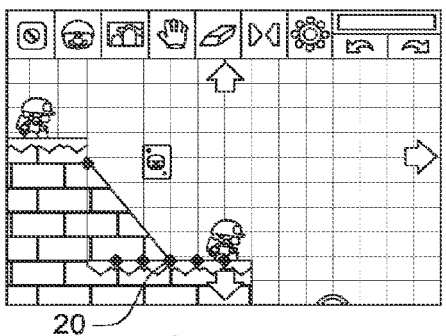
Figure 2F:
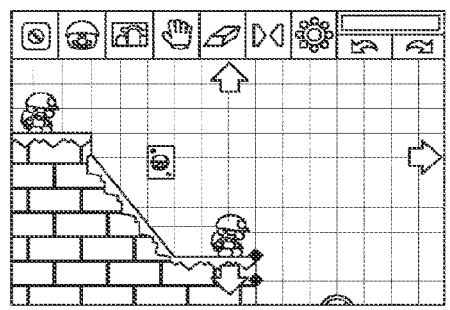
Figure 2G:
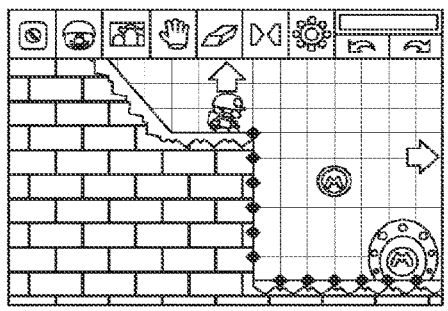
Figure 2H:
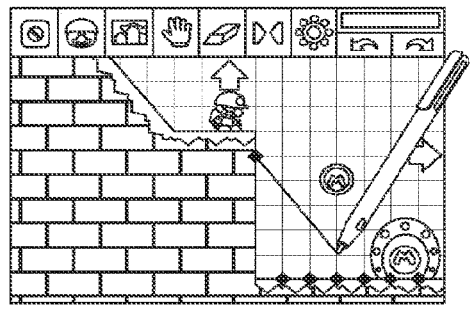
Figure 2I:
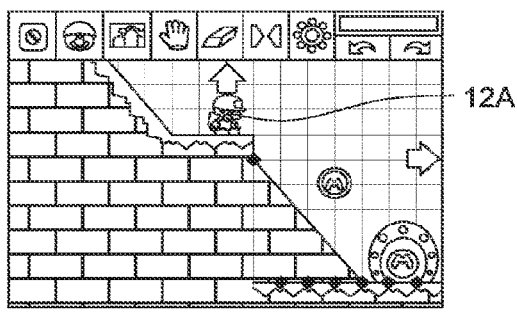
Figure 2J:
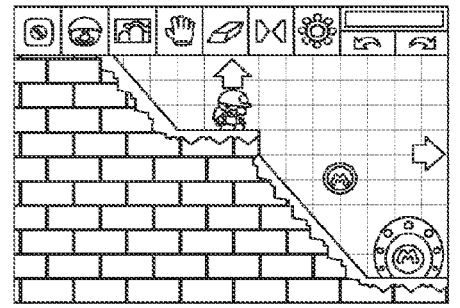
Figure 2K:
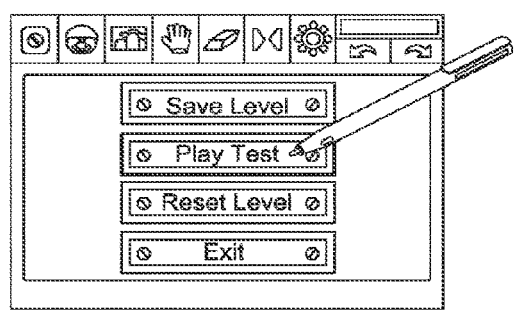
Figure 2L:
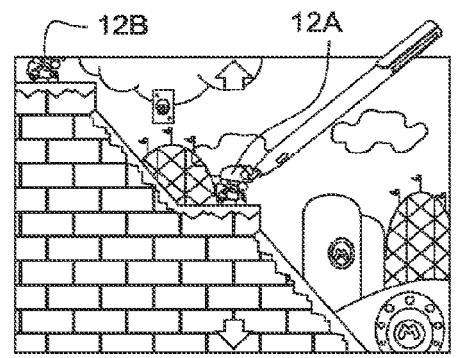
Figure 2M:
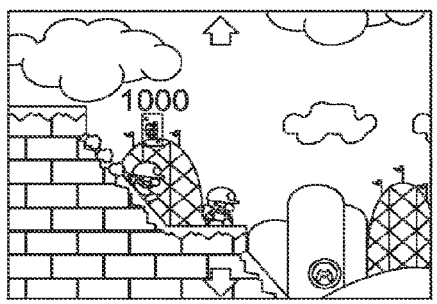
Figure 2N:
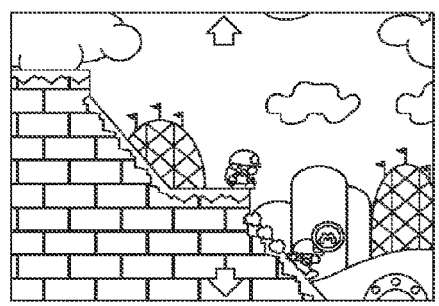
Figure 2O:
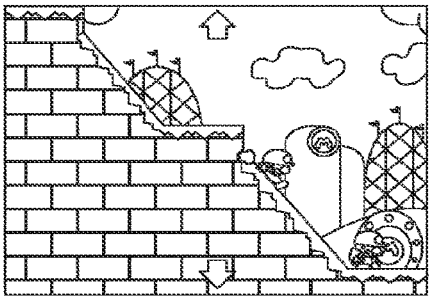

FIGS. 2A-2O show illustrative views of interaction with the exemplary editor program shown in FIG. 1;

FIGS. 2A-2B show example views that are presented to a user. Ground pieces are represented as bricks 14. Game-play objects 12A and 12B are also displayed. The game-play objects may be selectable by stylus 2. Arrows 13 are also displayed to facilitate viewing different parts of a layout if the layout is too big to be displayed on the user's display. For example, a user may operate the stylus 2 and press down on an area associated with the arrows 13 to cause the display to scroll in the direction of the arrow.

FIG. 2C shows a feature of the editor where a user may select different types of objects (e.g., via the stylus 2) to place into the environment. Object 15 may be a selection that corresponds to the placement of slope terrain. Accordingly, in creating a new slope, the user selects point 18 with the stylus 2 in FIG. 2D and draws a line with the stylus 2 to the valid point 20. In connecting point 18 to point 20 with the drawn line, a slope is created from this valid connection. During the slope creation process terrain that matches the currently displayed terrain may be added to the newly created slope as shown in FIG. 2F. Such techniques for adding textures may be found in, for example, the U.S. Application entitled "METHOD AND APPARATUS FOR CONSTRUCTING VIRTUAL SLOPED LANDSCAPES IN COMPUTER GRAPHICS AND ANIMATION" (U.S. application Ser. No. 13/160,305), the entire contents of which are hereby incorporated by reference.

FIGS. 2G-2J show a similar technique for creating a slope below the game-play object 12A (e.g., where the slope shown in the previous FIGS. 2A-2F was above the object 12A).

Figure 2P:
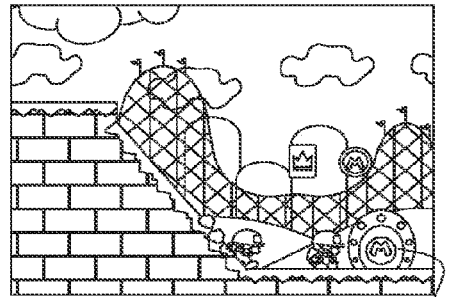

After completing the slope creation described above, a user may then play a game based on the recently created environment. Accordingly, in FIG. 2K, a level is saved and a user may select to "play test" the level. In FIG. 2L, the level is loaded as a game. A user may then activate object 12B (e.g., by tapping the object with the stylus) to cause the object to automatically move forward. Upon reaching the newly created slope, an animation is performed of the object sliding down the slope in FIG. 2M. Upon reaching the bottom of the first slope the object 12B "hits" object 12A to thereby cause the object 12A to activate. Accordingly, both objects proceed forward and slide down the next slope in FIGS. 2N-2P. In FIG. 2P the objects reach a goal 22.

Figure 3:
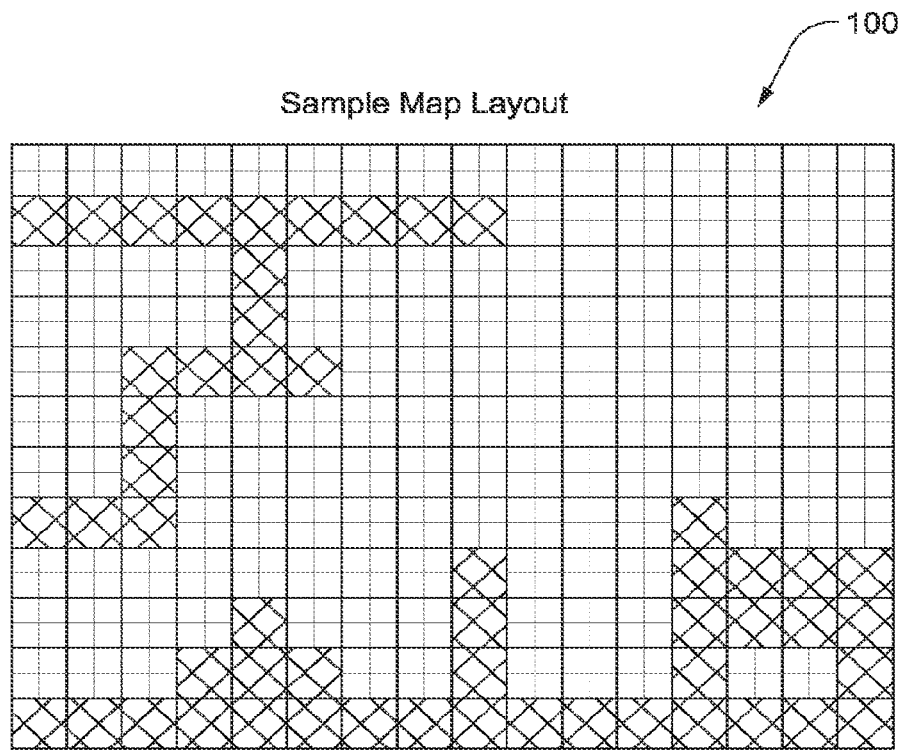
FIG. 3 shows an example user interface of an exemplary editor program according to certain example embodiments.

FIG. 3 shows an example user interface of an exemplary editor program according to certain example embodiments. A user may be presented with a layout 100 that includes different terrain and/or objects. In certain example embodiments, the layout may be a pre-configured layout that is saved into memory of a computing system and presented at the user's request. In certain example embodiments, the layout may initially be a blank screen that the user populates with terrain and/or objects. Thus, a user may create the layout by placing terrain into the layout. In certain example embodiments, the terrain may include "ground" terrain that may form a base layout.

Figure 4:
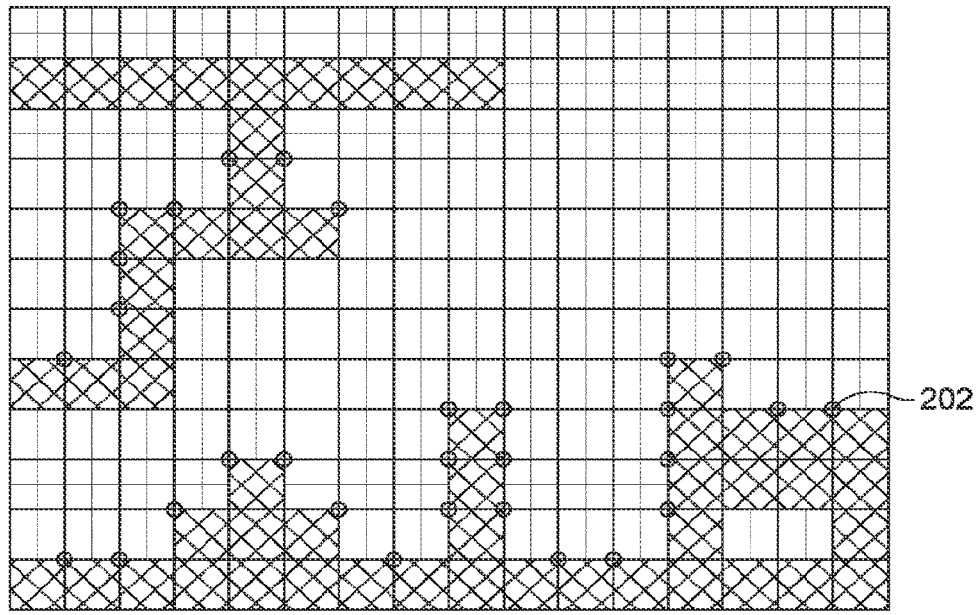
FIG. 4 shows example edit positions of the exemplary editor program.

FIG. 4 shows example edit positions based on the layout shown in FIG. 3. Editable positions may be shown to a user by displaying a small circle around the editable position (e.g., position 202). In certain example embodiments, the editable positions may be toggled on an off depending on an editing task currently being executed by a user of the editor program. For example, the task may be the creation of a slope (or slopes) between two or more editable positions. In certain example embodiments, the slops may be ground slops. Alternatively, the connections between the positions may be "bridges.". In certain example embodiments, the editable positions may be the beginning or end of a slope.

As discussed above, a layout may include terrain and/or objects. In certain example embodiments, terrain may be a terrain "object" (e.g., in that terrain is one type of object). Further, in certain example embodiments, one type of a terrain object may be a "Ground Piece" object. A Ground Piece object may be designed to take up one square unit of a map or layout (e.g., a 2-dimensional map layout). In certain example embodiments, a ground piece may have dimensions for a virtual three-dimensional space.

Certain example embodiments may include criteria for determining the points on a layout that are valid edit points.

As can be seen in FIG. 4, not all of the potential points are editable points. For example, points that are located at a vertex of a right may be prohibited from being "valid" edit points.

Certain example embodiments may include one or more of the following criteria for determining a valid "Slope Point" (e.g., a valid edit point for a slope): 1) a Slope Point may only attach to a Ground Piece object (e.g., as discussed above); and 2) only the top-left and top-right points of a Ground Piece object can be used as a Slope Point. In certain example embodiments, these restrictions may be put in place to avoid or prevent a slope from connecting to the base of a ground piece and creating undesirable collisions. However, in certain example embodiments, a bottom corner of a Ground Piece may be used when the proposed slope proceeds in a downward direction.

In certain example embodiments, a point may be determined to be an invalid point if the point touches a boundary edge of the layout map. For example, in a layout that is 20 by 20 units, a point at unit 20 may be determined to be an invalid slope point.

In certain example embodiments, a point may also be invalidated if it touches more than three ground pieces. For example, point 302 in FIG. 5 touches more than 3 ground pieces (the lower-right, upper-right, and upper-left of three ground pieces.

In certain example embodiments, a point may be invalidated if there are no other possible connection points. For example, all points in a layout may be invalidated when all of the Ground Pieces are flat. Techniques for determining an invalid point are described in greater detail below. In certain example embodiments, a point may also be invalid because it already contains a slope.

Figure 5:
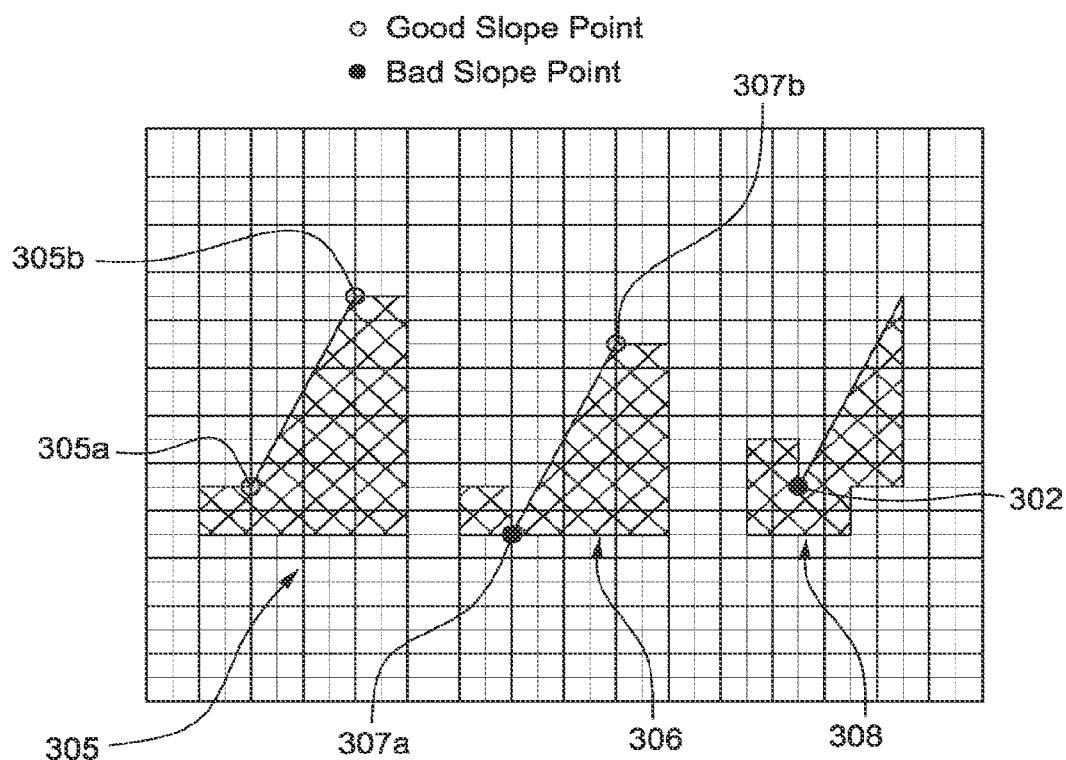
FIG. 5 shows example user actions of the exemplary editor program according to certain example embodiments.

FIG. 5 shows example user actions for an exemplary editor program according to certain example embodiments. In the first example 304 of FIG. 5, a user creates a valid connection between two valid slope points 305a and 305b. The two valid points are the top right and top left points of the respective ground pieces. As can be seen, these are valid slope points (e.g., based on the restrictions on slope points discussed above). Accordingly, a valid connection is created and results in the creation of a slope terrain between the two points. In the second example 306 of FIG. 5, the point 307a is the bottom right corner of the ground object. As discussed above, this situation may result in an invalid slope point. Accordingly, a slope between points 307a and 307b is not created. In the third example 308 of FIG. 5, the slope point 302, as discussed above, touches three different ground objects and is thus an invalid slope point.

Figure 6:
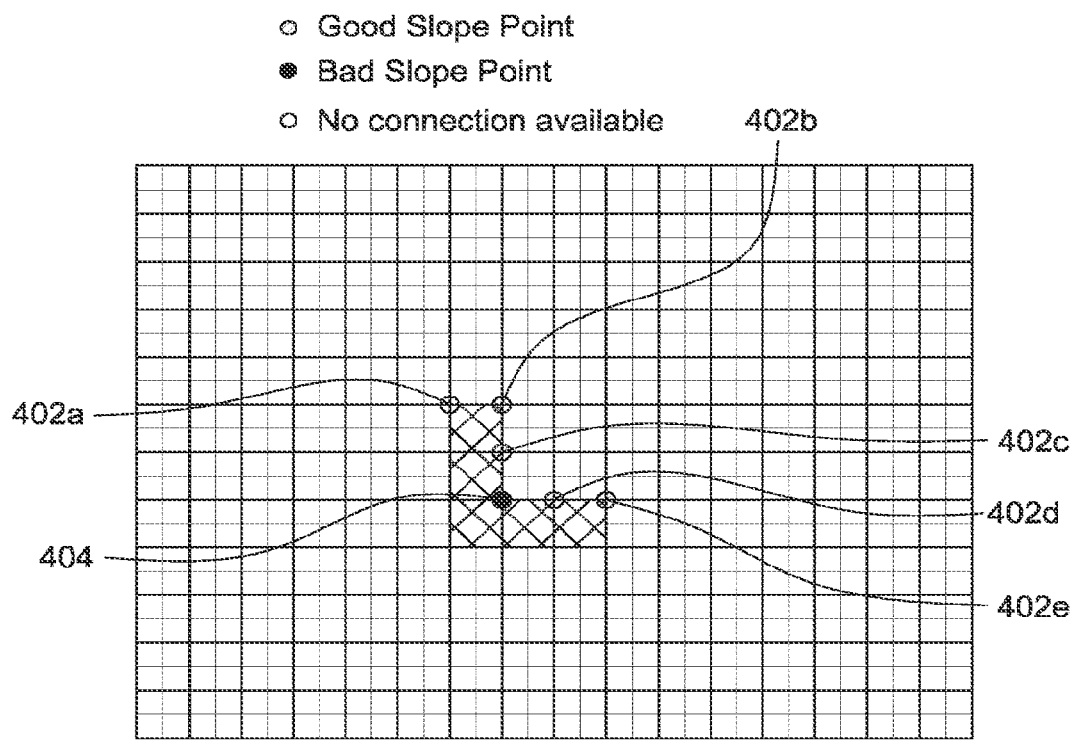
FIG. 6-7 show example edit positions of the exemplary editor program.

FIG. 6 shows example edit positions. Point 402a is a potentially valid edit point. However, there are no corresponding points that is may connect too. Accordingly, in certain example embodiments, point 402a may be designated as an invalid point or a point with no connection available. Also, point 404 touches 3 different Ground Pieces and is thus designated as an invalid slope point. The remaining points 402b, 402c, 402d, and 402e are valid edit points that a user may use as a basis for editing the existing terrain.

Figure 7:
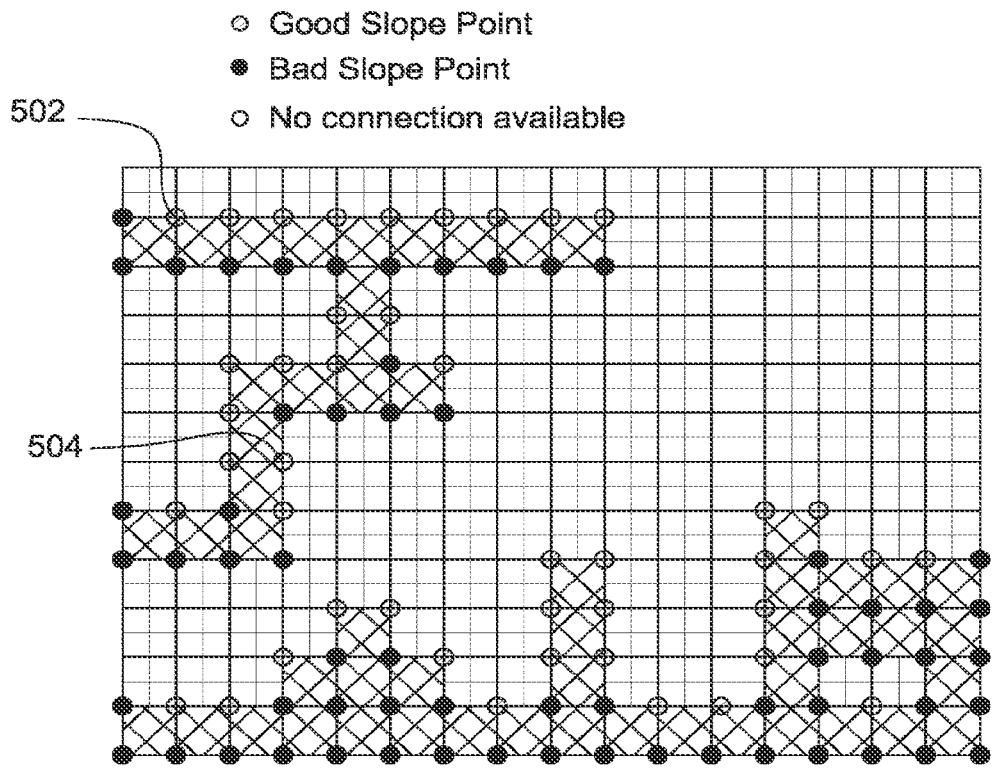

FIG. 7 shows example edit positions of the exemplary editor program. Here, all of the dark spots are invalid edit points. The circled points are potential valid edit points. However, some of these points are rendered invalid because there are no possible connecting valid edit points. For example, while points 502 and 504 are not invalid per se, there are no corresponding points that these points may connect too. Accordingly, in certain example embodiments, a user editing the layout or terrain may not select these points for editing.

Figure 8:
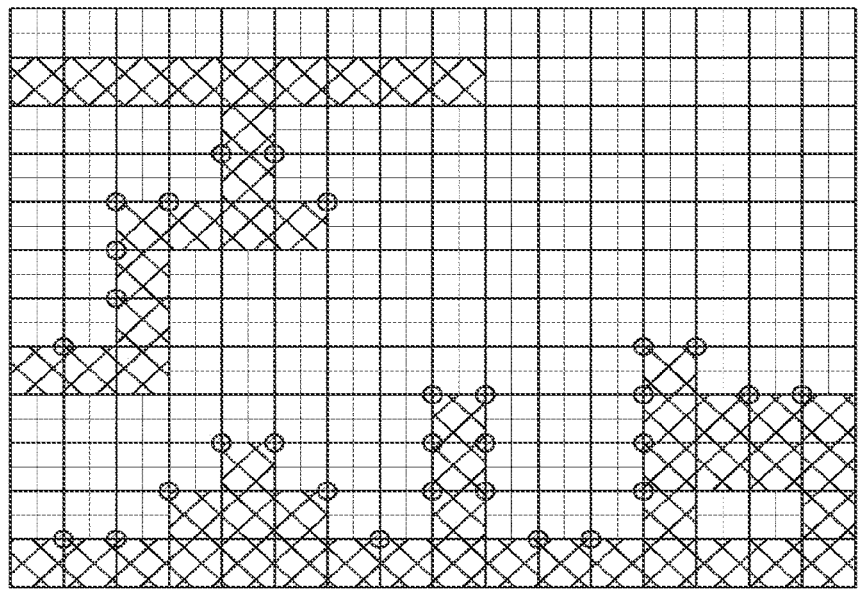
FIG. 8 shows example valid edit positions that are available for editing according to certain example embodiments.

FIG. 8 shows example valid edit positions that are available for editing based on the layout shown in FIG. 7. Note that, as discussed above, certain points that were not invalid are not shown in FIG. 8 (e.g., points 502 and 504). Accordingly, in certain example embodiments, a user may switch or turn on an editing mode and the shown points may become visible and available for slope creation.

Figure 9:
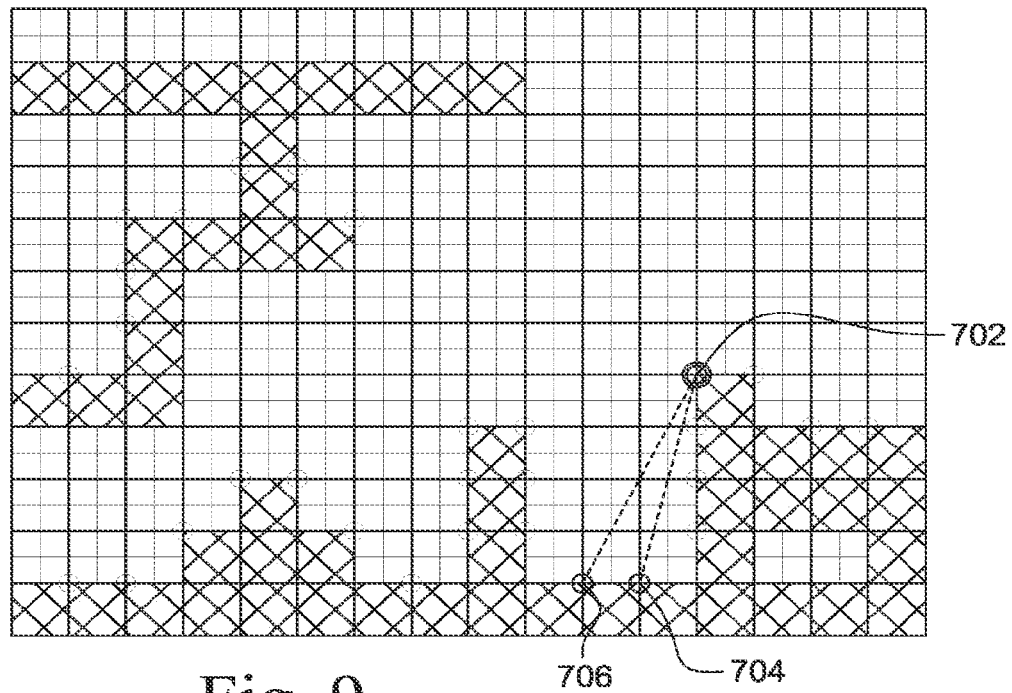
FIGS. 9-11 show an example placement of an object between two example editable points according to certain example embodiments.
Figure 10:
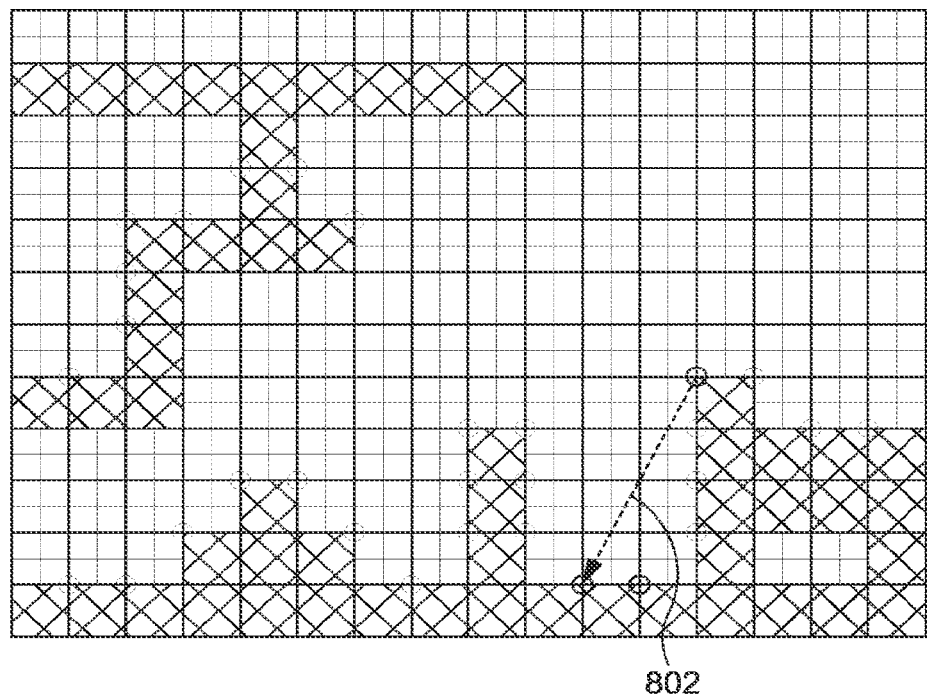
Figure 11:
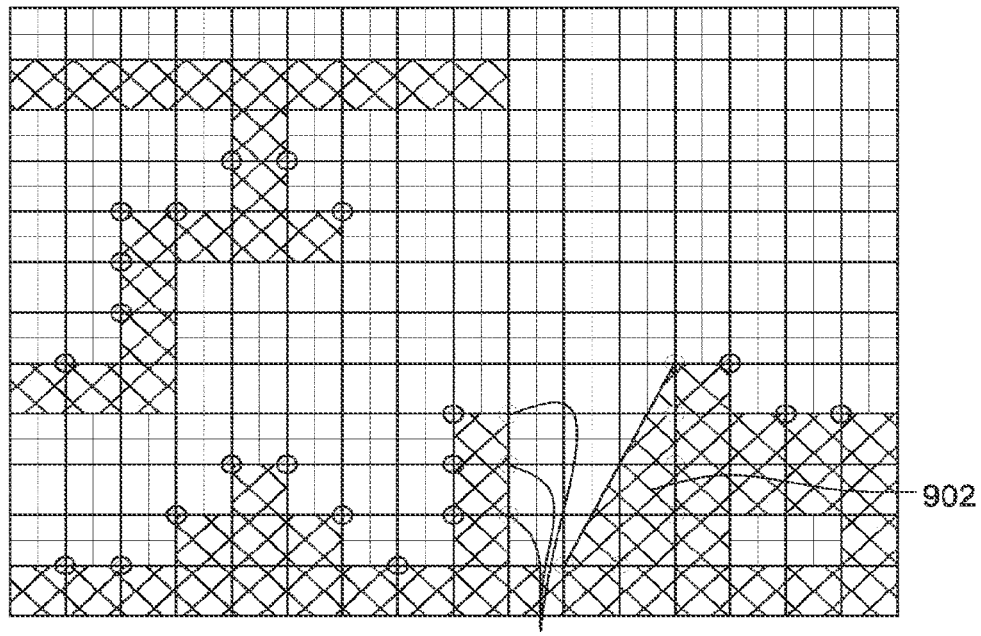

FIGS. 9-11 show an example placement of an object between two example editable points according to certain example embodiments. In certain example embodiments, slopes may be created between two editable points (e.g., slope points). In certain example embodiments, a user may select one of the editable points, for example, point 702 in FIG. 9 may be selected. In certain example embodiments, the selection of a valid point may be done with a stylus via touch screen (e.g., touch panel 2622 in FIG. 27A). It will be appreciated that other techniques for selecting editable points may be used. For example, a mouse or a person's finger (e.g., through a touch screen) may be used to select a valid edit point. Certain example embodiments may use camera(s) and/or other types of sensors to sense the location or movement of a controller or a part of a person's body. This information may be translated to a computer to facilitate the selection of an editable point of the layout.

In any event, a user may select point 702. In certain example embodiments, a selected point may be considered the start point of a yet to-be created slope. The selection of point 702 may cause only valid end points for slope creation to be displayed. As shown in FIG. 9, this may include points 704 and 706. The remaining points may be grayed out (e.g., not selectable as an end-point) or removed from the display completely.

FIG. 10 shows the user, after selecting point 702, drawing a line 802 to point 706. In certain example embodiments, the "drawing" may be accomplished by a user dragging a stylus across a touch screen. When the stylus is released above the valid end point 706, the line 802 connects points 702 and 706. After the connection is formed, the tiles (or tile portions) in the enclosed area 902 formed by ground pieces. Further, the line 802 is filled to form a slope between points 702 and 706. FIG. 11 shows the results of filling in the enclosed area 902.

As a result of the newly added slope to the layout, the valid points that are editable (or not editable) are updated. Accordingly, for example, points 904 that were previously valid edit points are now changed to be invalid and thus hidden or not displayed to a user.

In certain example embodiments, a user may drag a line from a valid point to a position in the layout that contains no valid end point. In this case, when the user releases the stylus (or mouse, or other user input device) the slope creation process may be reset. For example, the previously selected beginning point may be automatically unselected. In certain example embodiments, the initially selected slope point may remain selected.

Figure 12:
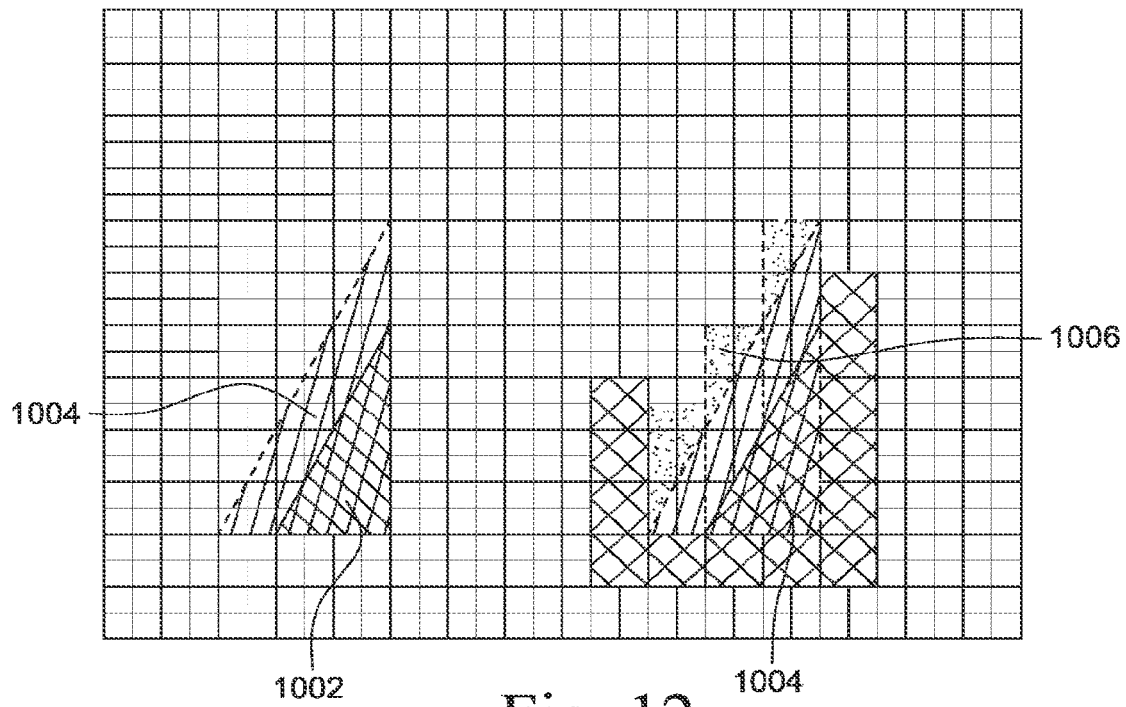
FIGS. 12-14 show example restrictions to placing objects between example editable points according to certain example embodiments.
Figure 13:
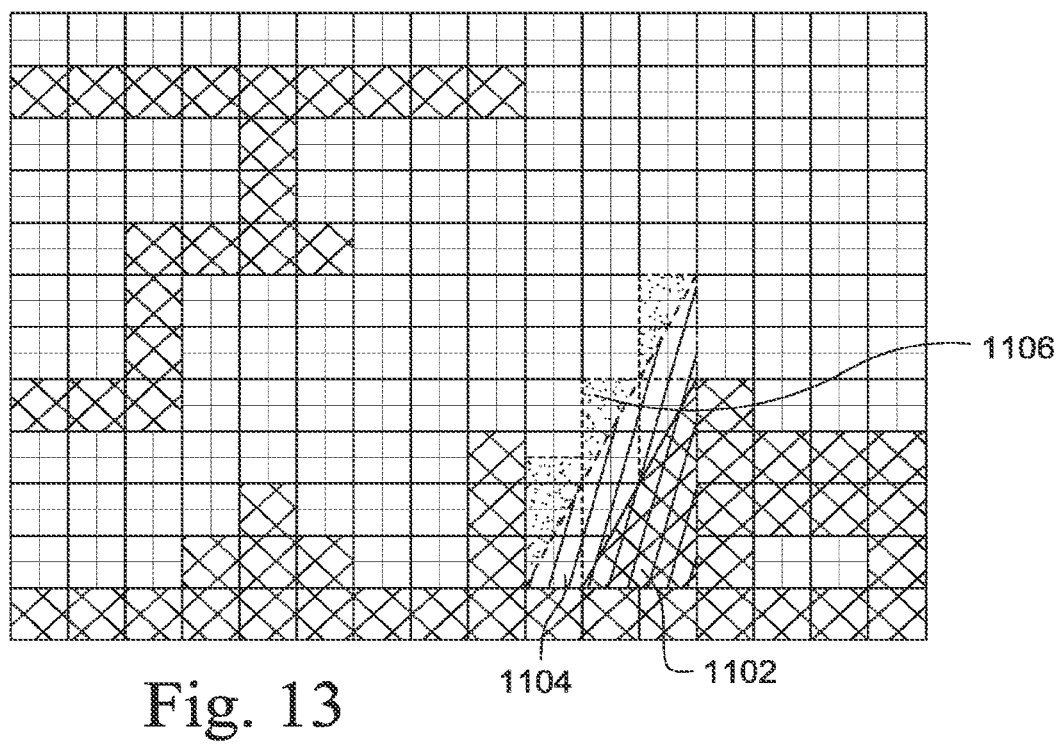
Figure 14:
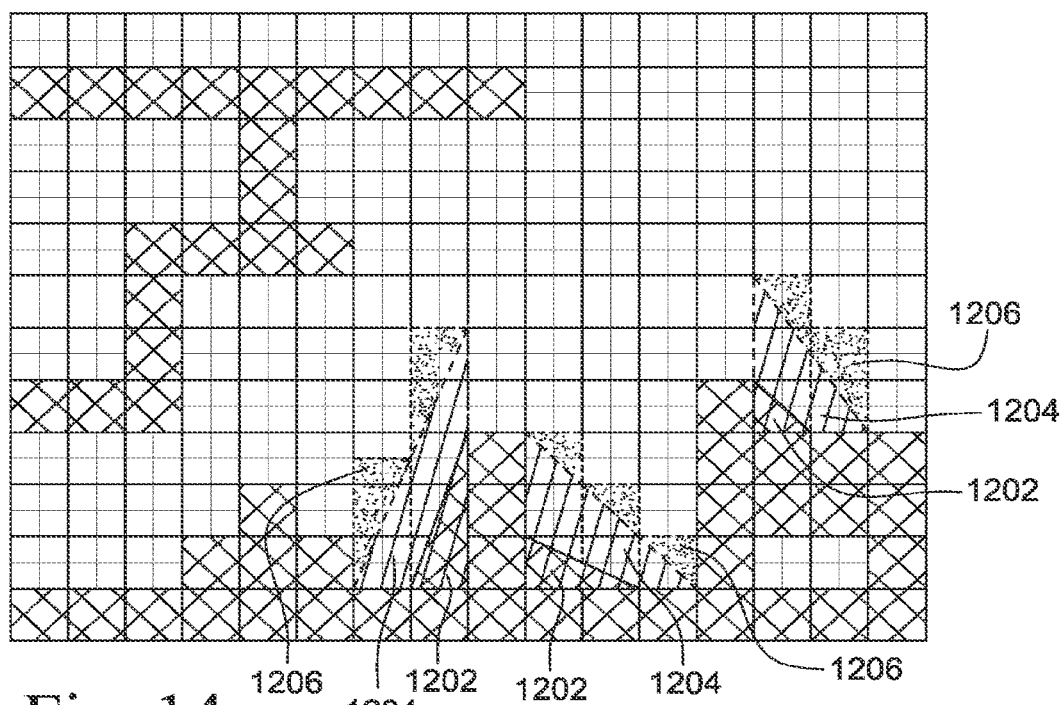

Certain example embodiments may include additional "rules" for the placement of slopes into an environment. FIGS. 12-14 show example restrictions for placing objects between example editable points according to certain example embodiments. In certain example embodiments, one restriction may include placement of new slopes above existing slopes. One technique for accomplishing this may be through the use of a "shadow triangle. Accordingly, grid space that is occupied by the shadow triangle may be classified as "restricted" such that a slope may not be created through such an area.

FIG. 12 shows a slope 1002 that has been created according to certain example embodiments. After creation of slope 1002, a shadow triangle 1004 may be maintained, created, by an editor program. Based on the shadow triangle, space in the grid of the layout may be considered "restricted" such that no slopes may be created within the restricted space. The second picture in FIG. 12 shows the restricted grid space 1006 in addition to the shadow triangle 1004.

FIGS. 13 and 14 show examples of shadow triangles and restricted space. For example based on a slope 1102, a shadow triangle 1104 is created. This shadow triangle is associated with a restricted area 1106. Similarly, in FIG. 14, slope area 1202 corresponds to shadow triangle 1204. The restricted area 1206 is then created based on the shadow triangle 1204.

In certain example embodiments, a shadow triangle may be extended to 2 grids vertically and 1 grid horizontally from a created slope. Other example embodiments may have different shadow triangle sizes (e.g., 1×1). In certain example embodiments, the shadow triangles may be used based on a world space coordinate system (e.g., in a three-dimensional world). However, whatever the technique used, certain portions of a layout may be classified as restricted.

In certain example embodiments, the nature of the restricted area may depend on the type of object that is being placed in the area. For example, terrain objects (e.g., Ground Pieces) may be restricted from the restricted area. However, other types of objects may be placed into the restricted area. For example, a virtual character or other type of virtual object may be placed into the area. The placement of these objects may be determined based on whether or not the object fits within the geometry of the area.

As discussed above, certain editable positions or points may be invalid for terrain modification purposes. In certain example embodiments, one condition may relate to the above discussed criteria for an editable point. The valid points may be further refined to discard those that have no valid connecting points.

Figure 15:
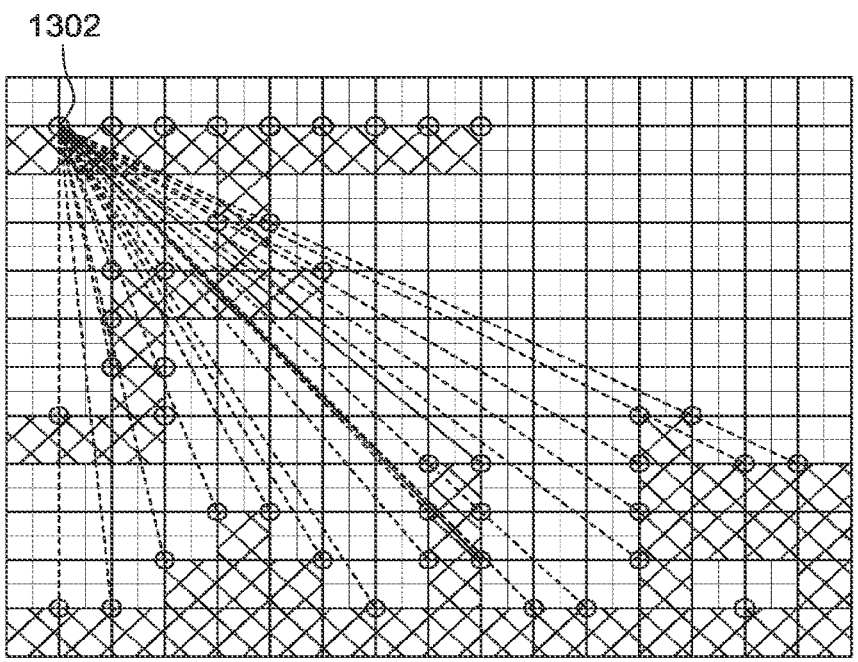
FIGS. 15-16 show example invalid designs for the exemplary environment.

FIG. 15 shows potential combinations for a point 1302. However, in certain example embodiments, when a line between the given edit point 1302 and another point intersects with a terrain block, the combination (e.g., attempted slope) is invalid. As can be seen in FIG. 15, point 1302 is invalid because there is no point above it, thus all the connections are either on the same level or down through the existing terrain geometry. This leads to determining that point 1302 is an invalid point.

Figure 16:
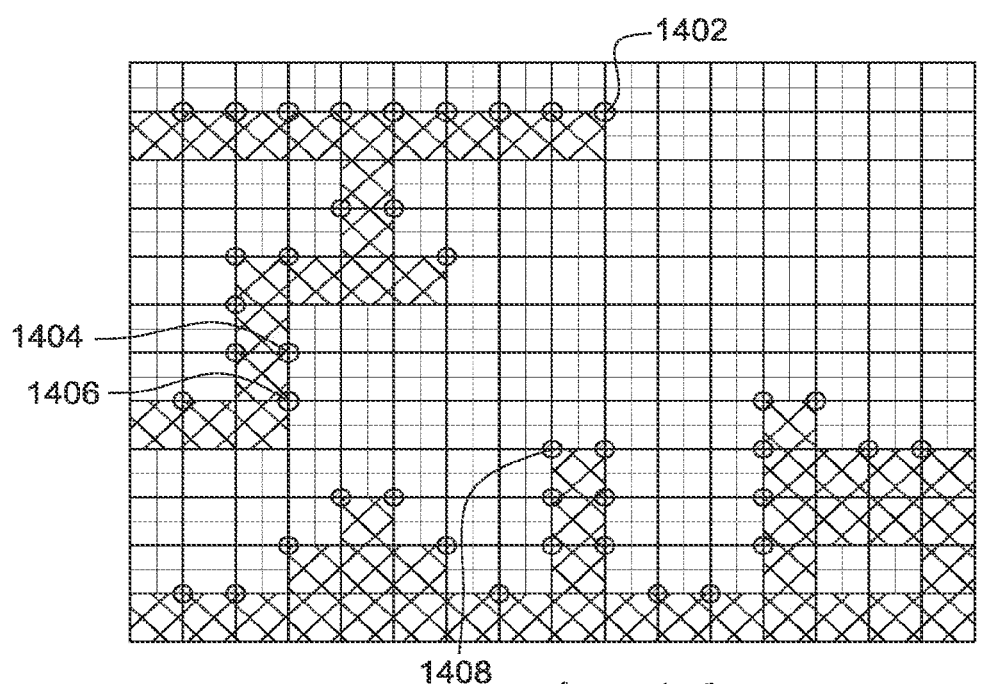

Certain example embodiments may also use additional rules for determining valid points. As shown in FIG. 16, points 1402, 1404, and 1406 all have clear connections to other points. For example, an uninterrupted connection may be formed from points 1404 and 1406 to point 1408. However, certain example embodiments may include an additional rule where a slop connection must be formed between connected terrain geometry that. Thus, points 1404 and 1406 may be determined to be invalid. In other words, for example, a slope may not be created between a floating island and a ground location. In certain example embodiments, the triangle that is drawn as a slope may not have the legs or "catheti" of the triangle exposed to non-terrain pieces (e.g., non Ground Pieces). Thus, referring to FIG. 16, a slope between point 1404 and 1408 would have the space below point 1408 empty. Such a slope would create a situation where the catheti of the triangle were exposed.

Alternatively, or in addition to, certain example embodiments may automatically fill in terrain that us "under" the slope" with additional ground pieces. In other embodiments the slope may be drawn "as is" without filling in the area below the slope.

Certain example embodiments, in addition to the terrain geometry or ground pieces, may include other types of objects. For example, a player character or an obstacle may be placed into the layout.

Figure 17:
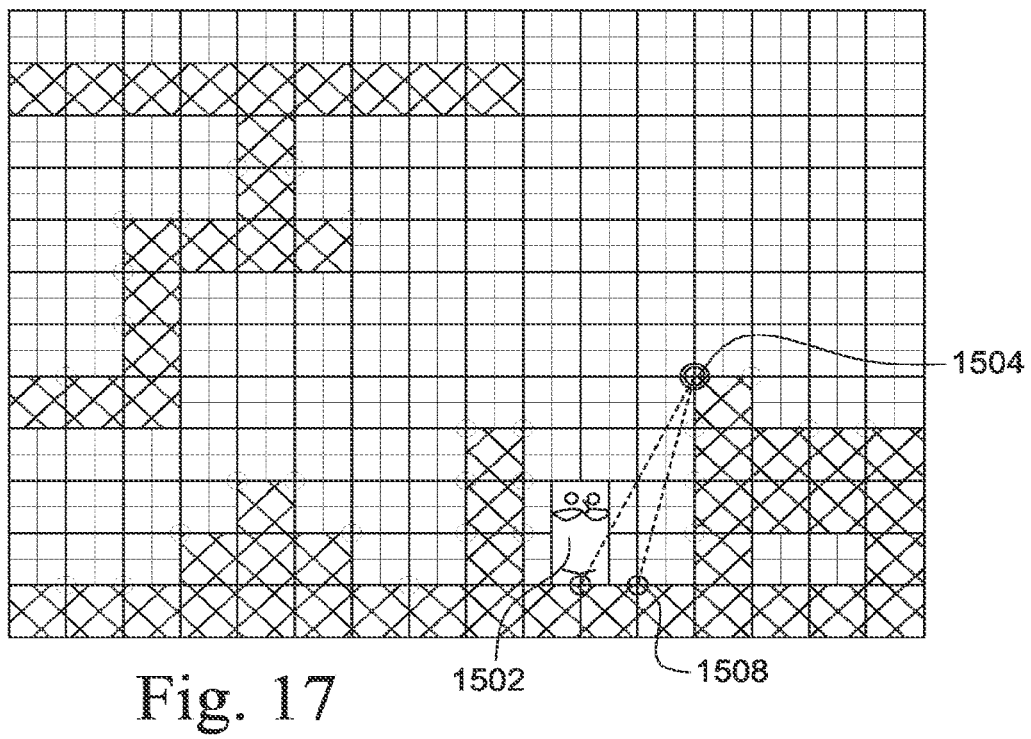
FIGS. 17-19 show views of exemplary designs for an environment that includes a object according to certain example embodiments.
Figure 18:
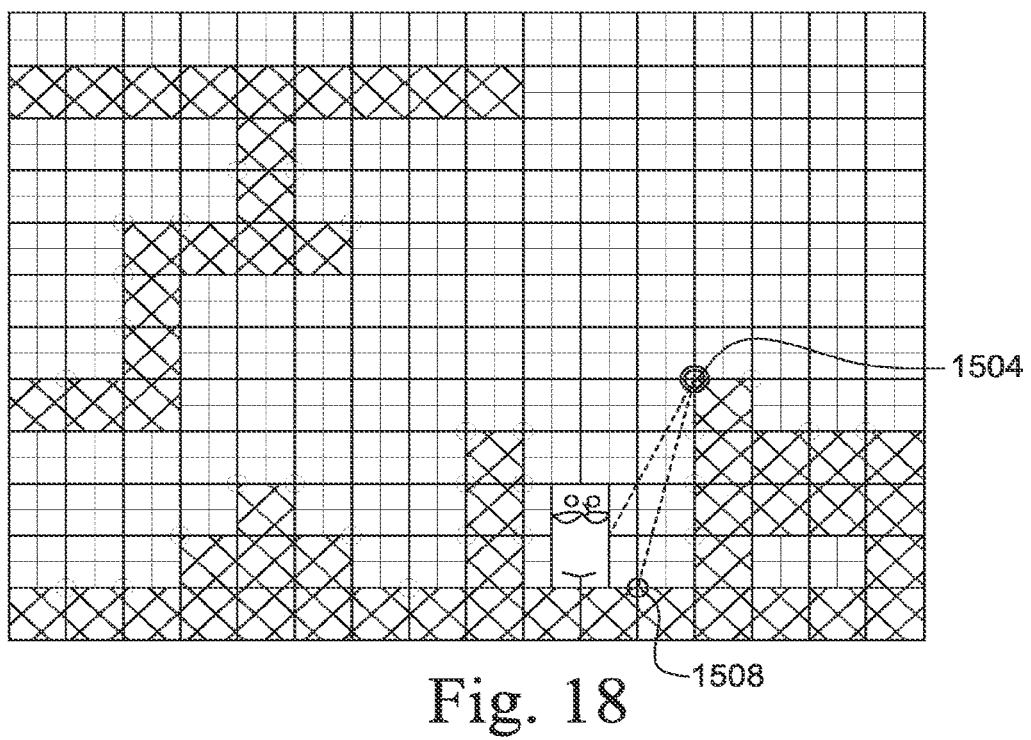
Figure 19:
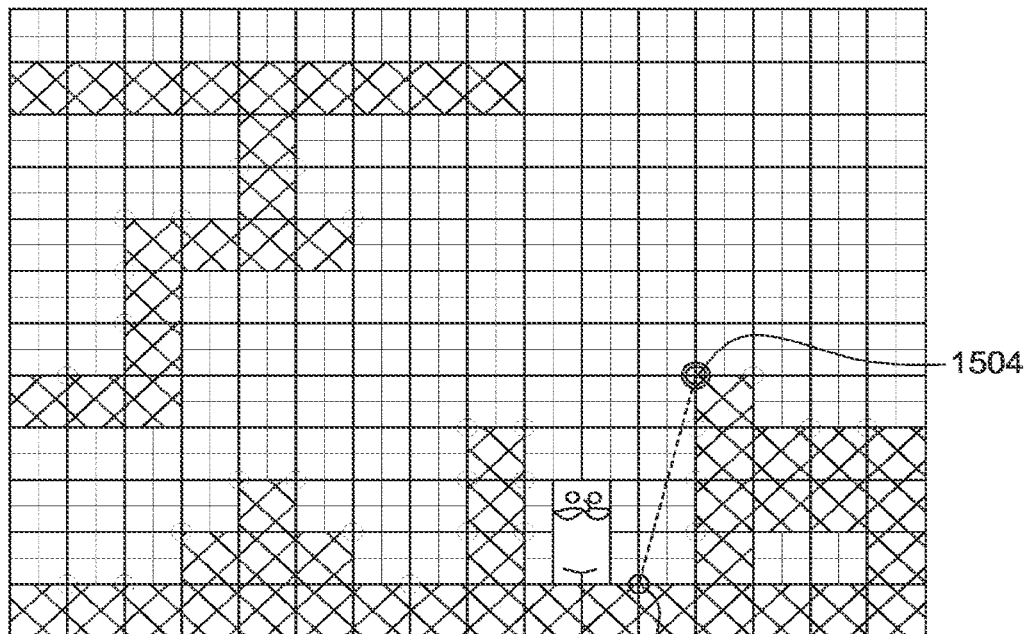

FIGS. 17-19 show views of exemplary designs for an environment that includes an object according to certain example embodiments. A player character 1502 is placed into the display environment. Here, a user selects point 1504. As explained above potentially valid points are then calculated based on the selected point. However, in this example, the object 1502 is present in the environment. Accordingly, a zone is created around the object 1502 to visually inform the user that the zone is a restricted area. In certain example embodiments, this zone may function similar to bounding box. Accordingly, slope lines (e.g., potential slope lines) that may intersect with this zone and their corresponding end points may be removed as selectable end points. In certain example embodiments, the end points may still be displayed, but may not be selectable. Alternatively, the end points may not be displayed or selectable. Thus, in FIG. 17 point 1506 is removed as a potentially valid point. This leaves point 1508 as the only valid point that may form a slope with point 1504. Accordingly, the user, in FIGS. 18-19, forms a connection between points 1504 and 1508 and a slope is created.

Figure 20:
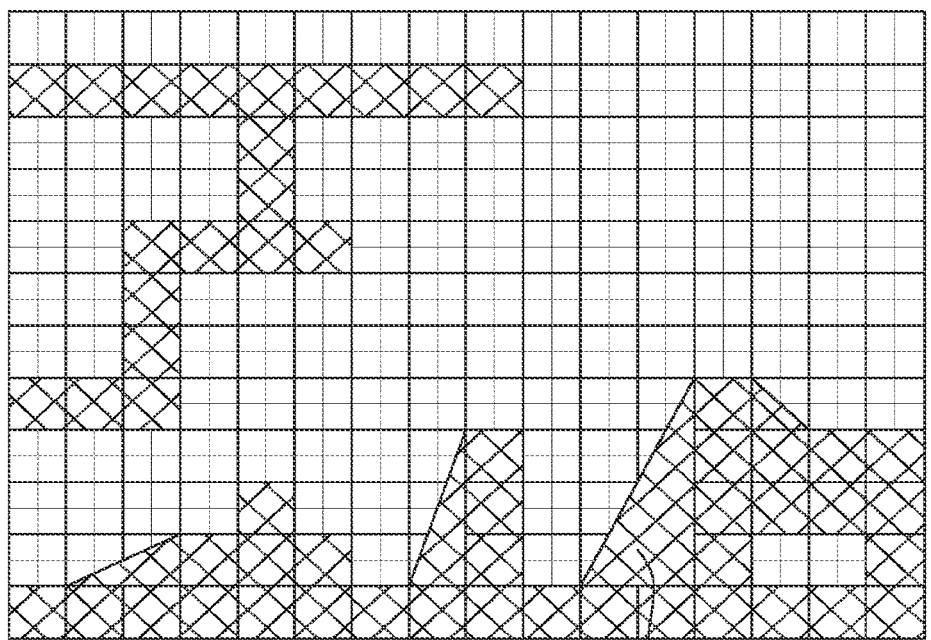
FIGS. 20-23 show views of example actions for deleting terrain from an example environment.
Figure 21:
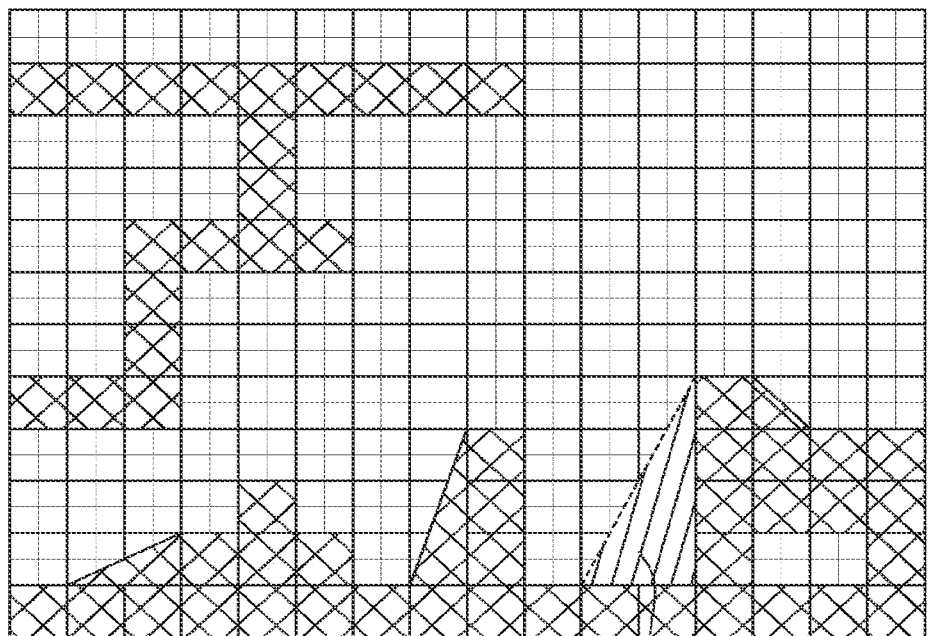

In certain example embodiments, an editing program may allow users to delete slopes. FIGS. 20-23 show views of example actions for deleting terrain from an example environment. First, FIG. 20 shows example slopes that have been created by a user, for example slope 1802. In certain example embodiments, a user may be able to specify a portion of the environment to delete (e.g., erase). A user may specify a portion of slope 1802. In certain example embodiments, this may, in turn, cause all of slope 1802 to be highlighted. An indication may be provided to the user as to the extent of the deletion that is to be performed. In certain example embodiments, a predetermined time period may be used before the deletion takes places. In the intervening time period, the user may cancel the operation. In certain example embodiments, the user may be asked to verify the deletion (e.g., by pressing or clicking a button). In either case, the slope 1802 may be deleted as shown in FIG. 21.

Figure 22:
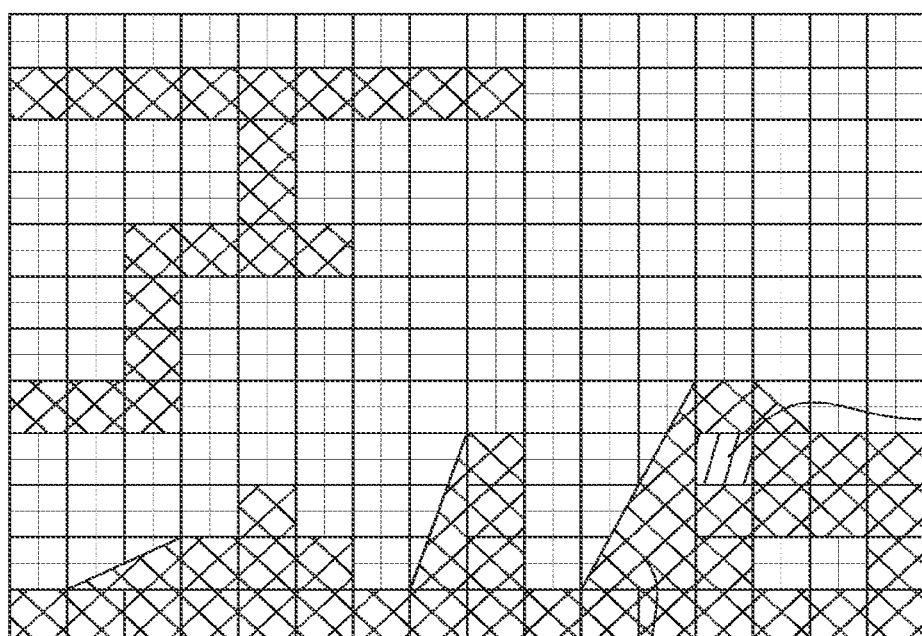
Figure 23:
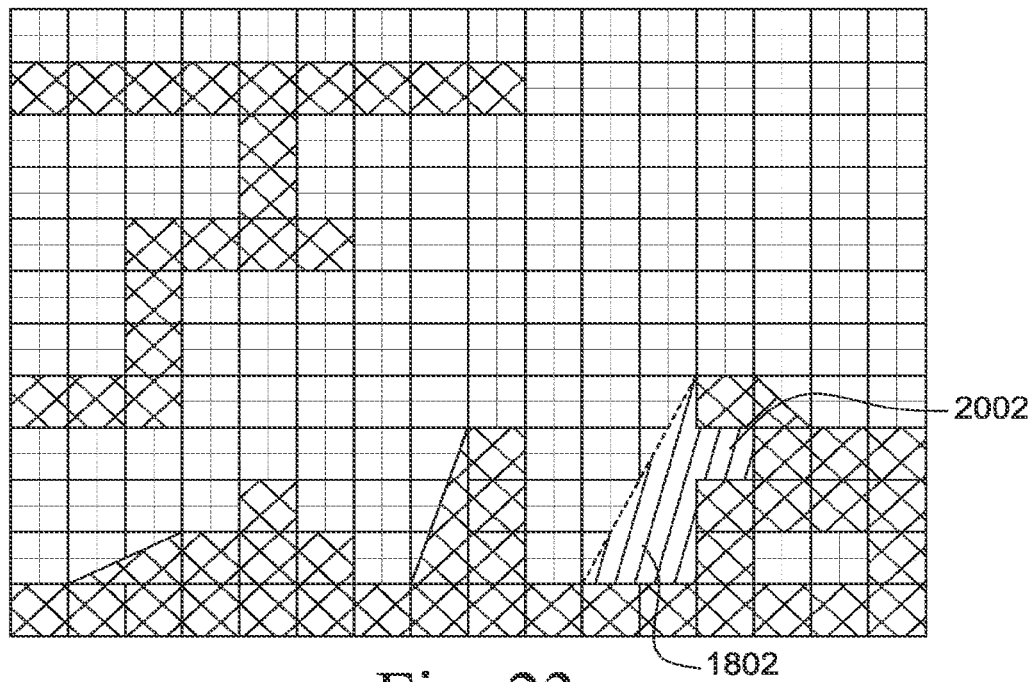

Another instance where a slope may be deleted may include where a ground piece that is adjacent to the slope is deleted. As noted above, certain example embodiments prohibit slopes where the legs of the slope triangle are exposed to "open" air or do not have a ground piece back them. Accordingly, as shown in FIG. 22, deletion of space 2002 may case the automatic deletion of slope area 1802 in addition to space 2002 as shown in FIG. 23.

Figure 24:
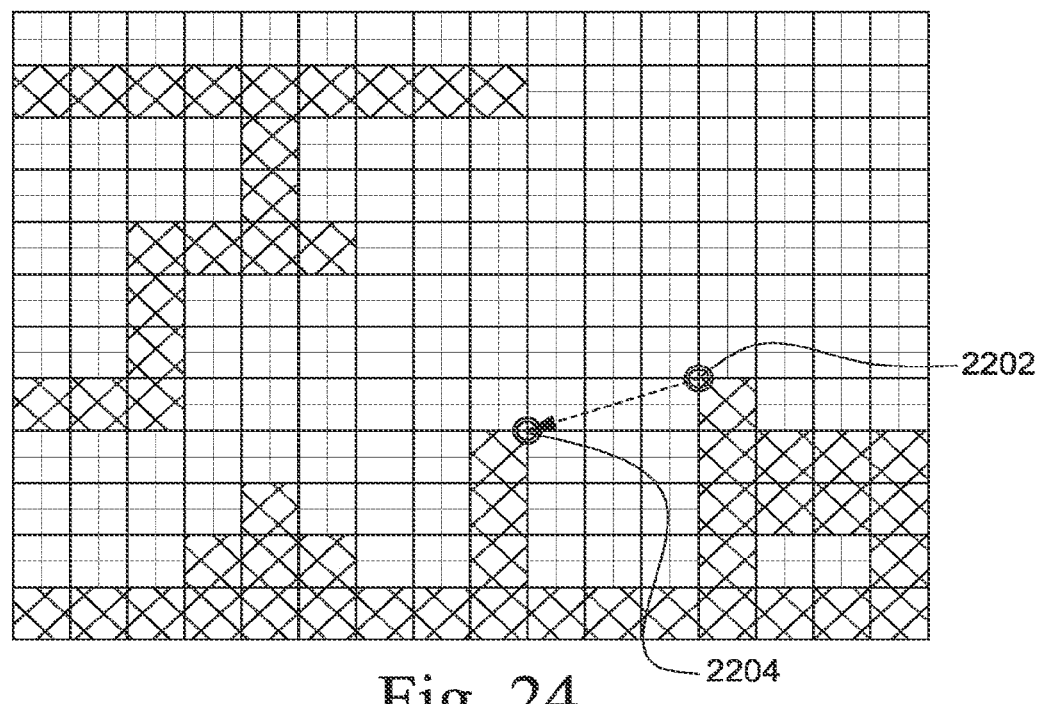
FIG. 24 shows an example prohibited action for creating terrain according to certain example embodiments.

FIG. 24 shows an example prohibited action for creating terrain according to certain example embodiments. As explained above, creation of a slope between two points where the legs of the slope triangle are not backed by ground pieces may be prohibited. Thus, a slope between point 2202 and point 2204 may be prohibited because of the empty space that would exist beneath the slope.

Figure 25:
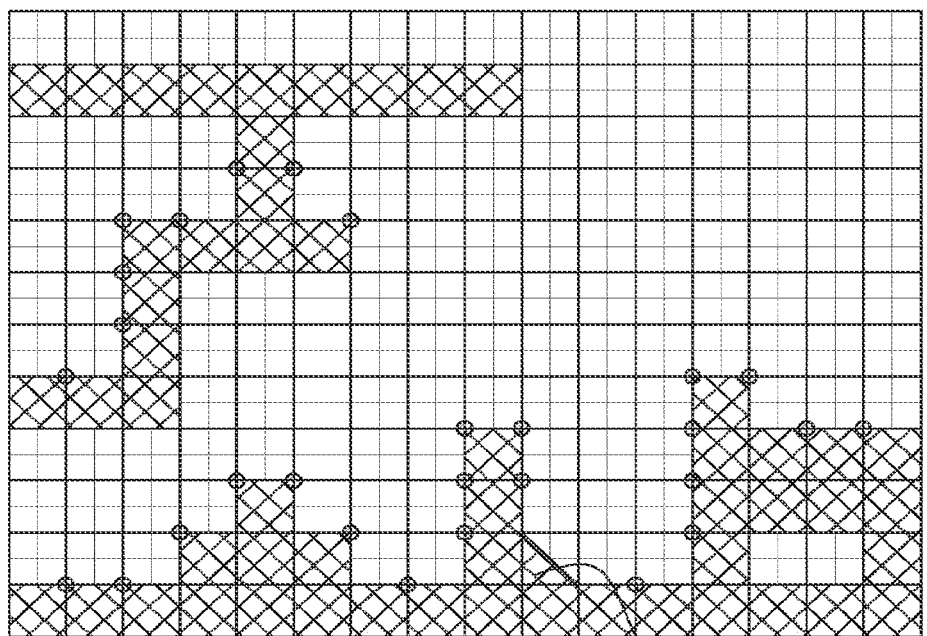
FIGS. 25-26 show another example prohibited terrain creation action according to certain example embodiments.
Figure 26:
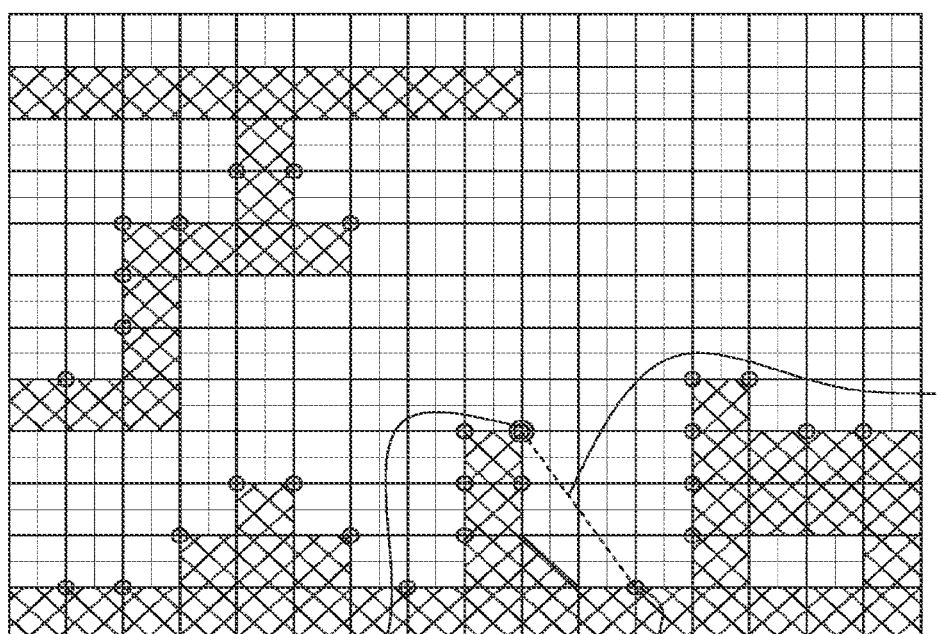

FIGS. 25-26 show another example prohibited terrain creation action according to certain example embodiments. Here another example is shown that creating a slope 2400 between point 2402 and point 2404 over another slope 2302 is a prohibited action.

In certain example embodiments, the creation of the environment through the editor allows a user to design new and interesting levels. The newly created environments may also be shared with other users. This may be done through local exchanges of disks or the like or may be done by transferring the newly created environments to other users over a network (e.g., the internet).

Figure 27A:
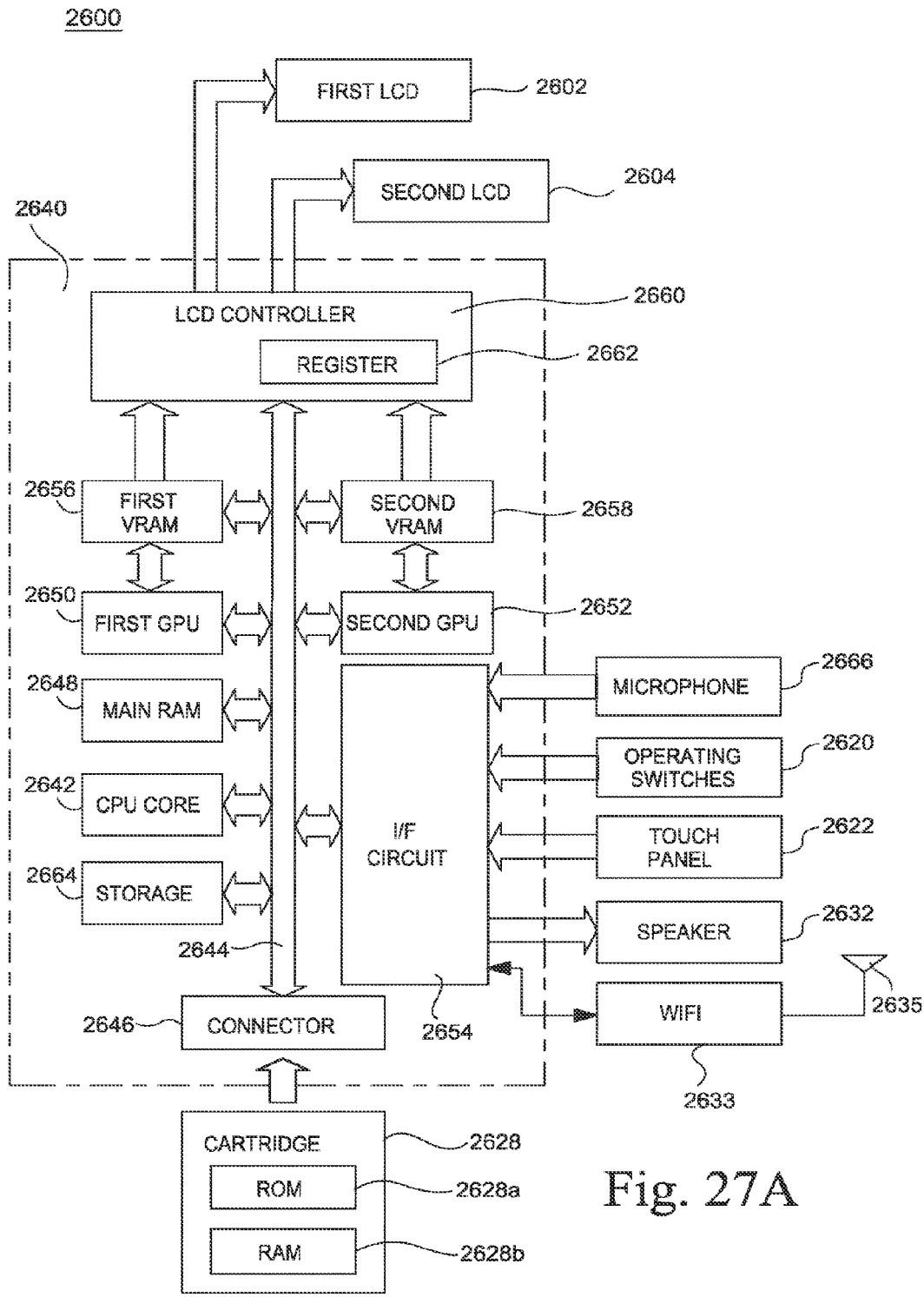
FIGS. 27A and 27B are block diagrams showing an internal structure of exemplary computing apparatuses according to certain example embodiments.

FIG. 27A is a block diagram showing an internal structure of an exemplary computing apparatus according to certain example embodiments, which may be based on or comprise a conventional handheld computing device such as a Nintendo DS™ or DSi™ video game system. Electronic circuit board 2640 may be disposed in a housing. Electronic circuit board 2640 may have a CPU core 2642 mounted thereon. CPU core 2642 may be connected to bus 44. Bus 2644 facilitates the transfer of data between the connected components.

Connector 2646 connects to bus 2644. Cartridge 2628 may be detachably connectable to connector 2646. Cartridge 2628 may be a memory medium for the storage of data that may be accessible to system 2600 when cartridge 2628 is mated to connector 2646. Cartridge 2628 may include a nonvolatile semiconductor memory such as a ROM or a flash memory. Other medium types for storing data may also be used such as, for example, a CD-ROM, a DVD, or a similar optical memory medium.

Cartridge 2628 might comprise a SD card or similar non-transitory memory medium, or may be split into discrete memory types. First, cartridge 2628 may have "read only memory" or ROM 2628a for storing application or static data. Such data may include, for example, environment templates or other type of program information that is to be displayed on system 2600. Cartridge 2628 may also optionally include RAM 2628b for rewritably storing backup or application data thereon. Such writable data may include, for example, options specific to a given environment template, saved environments created by a user that are stored in ROM 2628a, or other types of information created by a user (or the system 2600). Other implementations can use entirely embedded memory.

An editor program for environments may be stored in ROM 2628a in cartridge 2628 or in internal flash memory is loaded into main RAM 2648 and executed by CPU core 2642. Temporary data and data for generating an image which are obtained by the CPU core 2642 through execution of the application are stored in the main RAM 2648.

As described above, ROM 2628a stores an application, which is a group of instructions and a group of data in the format executable by the system 2600, especially by CPU core 2642. The application is read into and executed by main RAM 2648 when necessary. In this embodiment, the application and the like are recorded in the cartridge 2628, but the application and the like may be supplied by another medium (e.g., alternative storage) or via a communication network (e.g., a downloadable program).

Internal storage 2664 may also be included in system 2600. Similar to cartridge 2628, internal storage 2664 may store data. This data may include application software (e.g., programs) or application data (e.g., content). Internal storage 2664 may be flash memory or other similar nonvolatile memory for data storage. Data may be read from and written to storage 2664 as needed by system 2600.

A first GPU 2650 is connected to a first video RAM (hereinafter, referred to the "VRAM") 2656, and the second GPU 2652 is connected to a second VRAM 2658. In accordance with an instruction from CPU core 2642, the first GPU 2650 renders image data based on data for generating an image stored in main RAM 2648. The rendered image data from the first GPU 2650 may be stored in the first VRAM 2656. In accordance with an instruction from CPU core 2642, the second GPU 2652 renders image data based on data for generating an image stored in main RAM 2648. The rendered image data from the second GPU 2652 may be stored in the second VRAM 2658.

The first VRAM 2656 and the second VRAM 2658 are connected to LCD controller 2660. LCD controller 2660 includes register 2662, and register 2662 consists of, for example, one bit, and stores a value of "0" or "1" (data value) according to an instruction of CPU core 2642. LCD controller 2660 outputs the screen data rendered in the first VRAM 2656 to the first LCD 2602, and outputs the screen data rendered in the second VRAM 2658 to the second LCD 2604 in a case that the data value of the register 2662 is "0". Furthermore, LCD controller 2660 outputs the screen data rendered in the first VRAM 2656 to the second LCD 2604, and outputs the screen data rendered in the second VRAM 2658 to the first LCD 2602 in a case that the data value of register 62 is "1". It is noted that in the interests of simplicity, "0" is constantly stored in register 2662 in this exemplary illustrative embodiment.

An I/F circuit is a circuit for exchanging data between external input/output devices. In FIG. 27A I/F circuit 2654 is connected to touch panel 2622, operating switches 2620 (e.g., that interface with buttons of system 2600), speaker 2632, Wi-Fi adapter 2633, and microphone 2666. Touch panel 2622 may be located in the same area as the second LCD 2604. Operating switches 2620 may communicate with the buttons and switches. Speaker 2632 may provide audio output and microphone 2666 may provide audio input.

Wi-Fi adapter 2633 may be included to system 2600 to communicate with external network and thus facilitate network enabled features on the system 2600. For example a user may upload or download environments. Wi-Fi adapter 2633 may be a wireless adapter that supports 802.11b, 802.11g, or 802.11n. Alternatively, WiFi adapter 2633 may instead by a wired adapter that would use, for example, a wired Ethernet connection through a RJ 45 or other port.

Touch panel 2622 may have a coordinate system corresponding to the coordinate system of the second VRAM 2658 and may output coordinate position data corresponding to the position which is input (e.g., indicated) by a stylus or the like. The resolution of the touch panel may correspond to the resolution of the second LCD 2604. For example, the resolution of the second LCD 2604 may be 256 dots by 192 dots, and then the precision of touch panel 2622 would be 256 dots by 192 dots. Alternatively, the precision of the touch panel may be higher or lower than the precision of the second LCD. Further, another touch panel may be added to system 2600 that corresponds to the first LCD 2602. Alternatively, touch panel 2622 may correspond to the first LCD 2602.

Figure 27B:
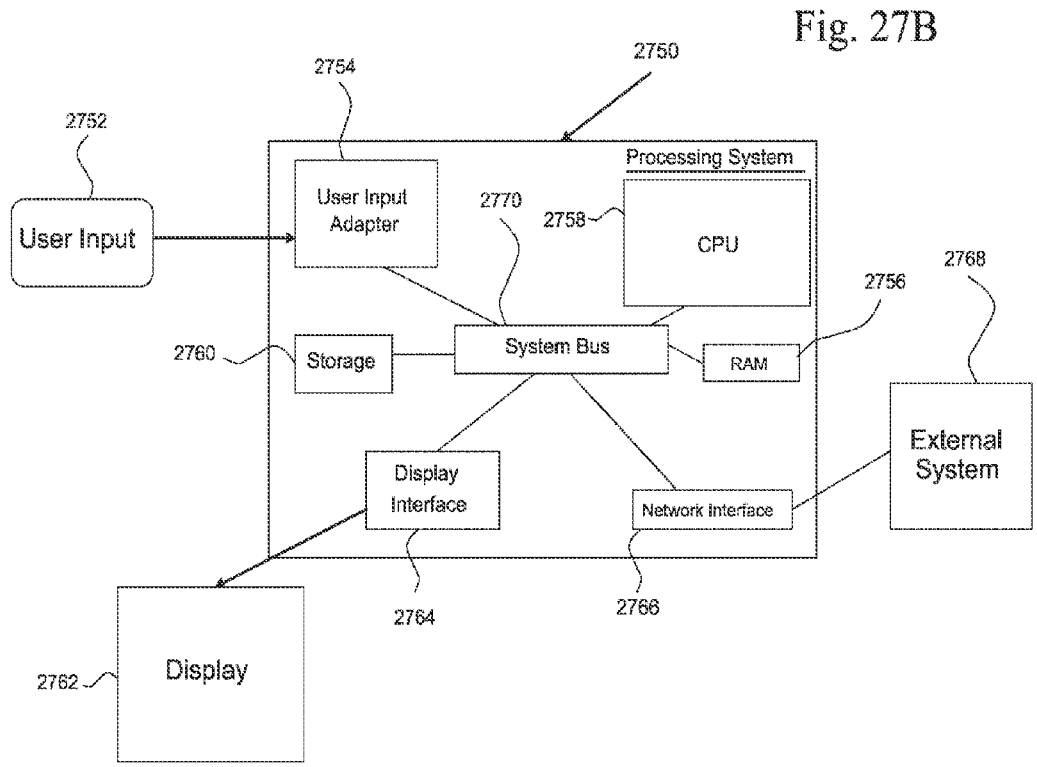

In certain example embodiments, the editing of an environment may occur on a personal computer (e.g., a desktop). FIG. 27B shows an example computing system for implementing the techniques described herein.

FIG. 27B is an example processing system configured to implement an editor system according to certain example embodiments. Processing system 2750 may include CPU 2758. The CPU 2758 may communicate with RAM 2756, storage medium 2760 of a system bus 2770. Processing system 2750 may facilitate user input through a user input adapter 2754 and user input 2752. For example, user input for controlling or providing input to an editor program may be provided through a keyboard, mouse, touch screen, or the like. Processing system may also provide an output through display interface 2764 to display 2762 (e.g., an LCD or other similar display device). The display 2762 and user input 2752 may be provided in the same device. For example a touch screen may be provided proximate to the display.

In certain example embodiments, processing system 2750 may also include a network interface 2766, such as, for example, an Ethernet card that provides wired or wireless connectivity to external resources. This may facilitate communication between the processing system 2750 and an external system 2768. External system 2768 may be another processing system (e.g., similar to processing system 2750) that stores levels that have been created by other users. Thus, in certain example embodiments, the levels may be shared between users via the communication connection.

Figure 28:
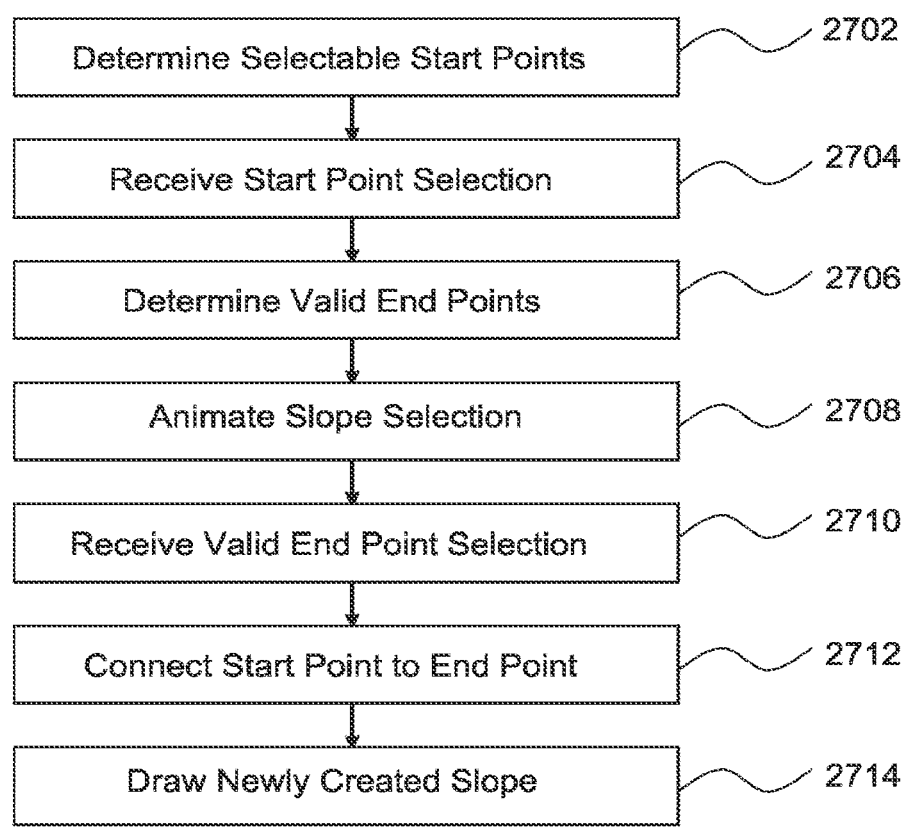
FIGS. 28-29 are example flow charts of exemplary processes for performing edits of an environment according to certain example embodiments.

FIG. 28 is an example flow chart showing an exemplary process for creating a slope in an environment according to certain example embodiments. Based on an existing environment, a number of valid start points may be displayed to a user in step 2702. Based on the displayed start points a user may perform a selection of one of the valid start points and relay the selection to a computer in step 2704. Based on the user selected start point, the valid end points for that start point may be determined in step 2706. These valid end points may be displayed to the user. The user may then perform a dragging operation (e.g., by moving a stylus or moving a mouse) across the environment. During this the display may be updated in step 2708 to reflect the path that a potential slope may take. A user may perform a selection of a valid end point in step 2710. Based on a received end point and the previously selected start point a line may be drawn between the two points in step 2712. This line may provisionally indicate the nature of the slope that is being created. After this, the slope may be fully created in step 2714 by filling in the area that is to be enclosed.

Further, as described, herein, various other steps may be added. For example, a texture may be subsequently added to the newly created slope. Furthermore, additional checks may be performed on the connection between start and end point (e.g., with respect to game objects in the environment). In any event, a new slope may be created and displayed to a user.

Figure 29:
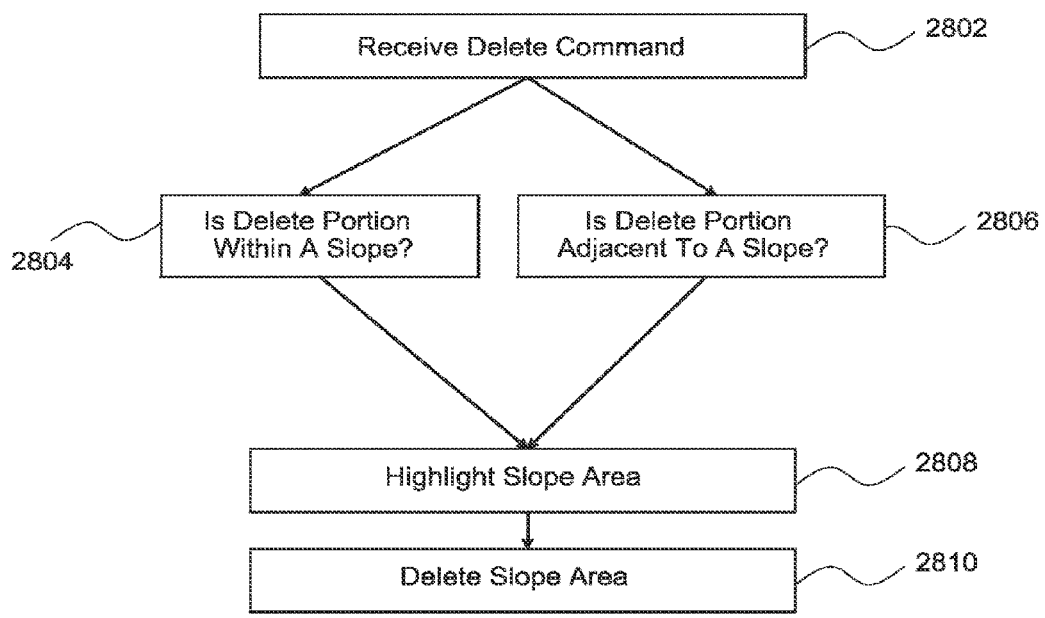

FIG. 29 is an illustrative flow chart showing an example process for deleting a slope from the environment. In certain example embodiments, a user may select a delete option from an editor. For example, an eraser tool may be selected by the user. The user may issue a command to delete a section of the environment in step 2802. After receiving this command, the computing system may perform two checks. First, in step 2804 the system may check to see if the indicated portion is within the triangle of a slope. Second, a check may be performed to see if the deleted portion is adjacent to a slope portion in step 2806. This may include checking if the deleted portion is adjacent to the legs of the slope triangle. If the checks in steps 2804 or 2806 are successful, then the slope is to be deleted. Accordingly, in step 2808 the slope area is highlighted. In the case were an adjacent portion of the environment is being deleted in addition to slope area, this portion may be additionally highlighted. The highlighting may act to inform a user of the nature of the deletion procedure. For example, a user may not realize that deleting a portion of the environment that is adjacent to the slope may also cause the slope to be deleted. In such a situation, there may be an additional check that asks the user to verify the deletion process (e.g., by clicking an "okay" box). After the area to be deleted is highlighted and/or the user confirms the deletion, the slope area (and the adjacent area) may be deleted in step 2810.

Certain example embodiments may include additional steps to those described above. Furthermore, some of the steps may be skipped. For example, the highlighting of the sloped area may be skipped and the area may simply be deleted based on the user's command.

While the technology herein has been described in connection with exemplary illustrative non-limiting embodiments, the invention is not to be limited by the disclosure. For example, the techniques herein may be applied to picture editing where certain portions of the image are classified according to color or depth in the image. The invention is intended to be defined by the claims and to cover all corresponding and equivalent arrangements whether or not specifically disclosed herein.

We claim:

1. A computer implemented method for designing virtual structures that are to be traversed by animated game characters in a virtual environment, the virtual environment including existing virtual structure, the method comprising:
   receiving, via an input device coupled to a computing system, a first input;
   selecting, based on the first input, a start point from among a plurality of connection points that are associated with an existing virtual structure to begin a new virtual structure;
   responsive to selection of the start point, determining and displaying at least one valid end point from among the plurality of connection points based on the start point wherein each of the valid end points form a connection of the new virtual structure from the valid end point to the selected start point such that the new virtual structure that would be created based on the connection does not intersect with the existing virtual structure;
   after selecting the start point, receiving a second input and selecting an end point from among the determined and displayed at least one valid end point based on the second input, the selected start point and the selected end point forming a valid connection of the new virtual structure between two portions of the existing virtual structure of the virtual environment;
   incorporating the new virtual structure into the virtual environment between the two portions of the existing virtual structure in accordance with the selection of the start point and selection of the end point; and
   outputting the virtual environment that includes the incorporated new virtual structure to a display.

2. The method of claim 1, further comprising:
   receiving, via the input device coupled to a computing system, a user selection of a delete position that relates to a portion of the virtual environment that is to be deleted;
   determining if the delete position is located within the new virtual structure; and
   updating the virtual environment to remove the new virtual structure based on the determination that the delete position is within the new virtual structure.

3. The method of claim 1, further comprising:
   determining if a delete position is located outside, yet proximate to, the new virtual structure; and
   updating the virtual environment to remove existing environmental structure based on the delete position,
   updating the virtual environment to remove the new virtual structure based on the determination that the delete position is proximate to the new virtual structure and the removal of the existing environmental structure.

4. The method of claim 1, wherein determination of the at least one valid end point includes a criteria of the start point and the at least one valid end point being on the same contiguous structure in the virtual environment.

5. The method of claim 1, wherein determination of the at least one valid end point includes a criteria that the start point and the at least one valid end point are vertexes of a right angle triangle that backs contiguous structure in the virtual environment.

6. The method of claim 5, wherein right angle triangles with catheti not backed by terrain are not valid end points.

7. The method of claim 1, further comprising:
initially setting the plurality of connection points from which the start point may be selected by removing connection points that have no possible valid end point for connection therewith.

8. A non-transitory storage medium storing instructions for modifying and/or creating a virtual world displayed, at least in part, on a display device of a computing system that includes at least one processor coupled to a memory device, the virtual world including existing virtual structure to be traversed by animated game characters, the virtual structure associated with a plurality of connection points for creating new virtual structure, the stored instructions comprising instructions configured to cause the computing system to:
accept, via an input device coupled to the computing system, a first input;
select, based on the first input, a start point from among a plurality of connection points that are associated with the existing virtual structure to begin a new virtual structure;
responsive to selection of the start point, determine and display at least one valid end point from among the plurality of connection points based on the start point wherein each of the valid end points form a connection of the new virtual structure from the valid end point to the selected start point such that the new virtual structure that would be created based on the connection does not intersect with the existing virtual structure;
after selection of the start point, accept a second input and select an end point from among the determined and displayed at least one valid end point based on the second input, the selected start point and the selected end point forming a valid connection of the new virtual structure between two portions of the existing virtual structure of the virtual world;
generate and add the new virtual structure into the virtual world between the two portions of the existing virtual structure in accordance with the selection of the start point and selection of the end point; and
output a view of the virtual world that includes the incorporated new virtual structure to the display device.

9. The medium of claim 8, wherein the stored instructions further comprise instructions that are configured to cause the computing system to:
accept, via the input device coupled to a computing system, a user selection of a delete position that relates to a portion of the virtual world t that is to be deleted;
determine if the delete position is located within the new virtual structure; and
update the virtual world to remove the new virtual structure based on the determination that the delete position is within the new virtual structure.

10. The medium of claim 8, wherein the stored instructions further comprise instructions that are configured to cause the computing system to:
determine if a delete position is located outside, yet proximate to, the new virtual structure; and
update the virtual world to remove existing environmental structure based on the delete position; and
update the virtual world to remove the new virtual structure based on the determination that the delete position is proximate to the new virtual structure and the removal of the existing environmental structure.

11. The medium of claim 8, wherein determination of the at least one valid end point includes a criteria of the start point and the at least one valid end point being on the same contiguous structure in the virtual world.

12. The medium of claim 8, wherein the stored instructions further comprise instructions that are configured to cause the computing system to:
initially set the plurality of connection points from which the start point may be selected by removing connection points that have no possible valid end point for connection therewith.

13. A computing apparatus for designing a virtual environment to include new visible structural elements, the virtual environment including existing virtual structure to be traversed by animated game characters, the computing apparatus comprising:
a user input device configured to accept a first input and a second input; and
a processing system that includes at least one processing circuit coupled to a memory device and the user input device, the processing system configured to:
select, based on the first input, a start point from among a plurality of connection points that are associated with the existing virtual structure to begin a new virtual structure;
responsive to selection of the start point, determine and display at least one valid end point from among the plurality of connection points based on the start point wherein each of the valid end points form a connection of the new virtual structure from the valid end point to the selected start point such that the new virtual structure that would be created based on the connection does not intersect with the existing virtual structure;
after selection of the start point, accept the second input and select an end point from among the determined and displayed at least one valid end point based on the second input, the selected start point and the selected end point forming a valid connection of the new virtual structure between two portions of the existing virtual structure of the virtual environment;
incorporate the new virtual structure into the virtual environment between the two portions of the existing virtual structure in accordance with the selection of the start point and selection of the end point; and
output the virtual environment that includes the incorporated new virtual structure to a display device.

14. The computing apparatus of claim 13, wherein the processing system is further configured to:
accept, via an input device coupled to a computing system, a user selection of a delete position that relates to a portion of the virtual environment that is to be deleted;
determine if the delete position is located within the new virtual structure; and update the virtual environment to remove the new virtual structure based on the determination that the delete position is within the new virtual structure.

15. The computing apparatus of claim 13, wherein the processing system is further configured to:
determine if a delete position is located outside, yet proximate to, the new virtual structure; and
update the virtual environment to remove existing environmental structure based on the delete position; and
update the virtual environment to remove the new virtual structure based on the determination that the delete position is proximate to the new virtual structure and the removal of the existing environmental structure.

16. The computing apparatus of claim 13, wherein determination of the at least one valid end point includes a criteria of the start point and the at least one valid end point being on the same contiguous structure in the virtual environment.

17. The computing apparatus of claim 13, wherein the processing system is further configured to:
initially set the plurality of connection points from which the start point may be selected by removing connection points that have no possible valid end point for connection therewith.

* * * * *